United States Patent
Kim et al.

(10) Patent No.: US 7,122,431 B2
(45) Date of Patent: Oct. 17, 2006

(54) METHODS OF FABRICATION METAL OXIDE SEMICONDUCTOR (MOS) TRANSISTORS HAVING BUFFER REGIONS BELOW SOURCE AND DRAIN REGIONS

(75) Inventors: Sung-Min Kim, Incheon-si (KR); Dong-Gun Park, Gyeonggi-do (KR); Sung-Young Lee, Gyeonggi-do (KR); Hye-Jin Cho, Gyeonggi-do (KR); Eun-Jung Yun, Seoul (KR); Shin-Ae Lee, Gyeonggi-do (KR); Chang-Woo Oh, Gyeonggi-do (KR); Jeong-Dong Choe, Gyeonggi-do (KR)

(73) Assignee: Samsung Electronics Co., Ltd., (KR)

( * ) Notice: Subject to any disclaimer, the term of this patent is extended or adjusted under 35 U.S.C. 154(b) by 0 days.

(21) Appl. No.: 10/754,676

(22) Filed: Jan. 9, 2004

(65) Prior Publication Data

US 2004/0155296 A1    Aug. 12, 2004

(30) Foreign Application Priority Data

Jan. 16, 2003  (KR) .................. 10-2003-0002995
Nov. 12, 2003  (KR) .................. 10-2003-0079861

(51) Int. Cl.
H01L 21/336  (2006.01)
H01L 21/3205  (2006.01)
H01L 21/00  (2006.01)
H01L 21/20  (2006.01)
H01L 21/425  (2006.01)

(52) U.S. Cl. .................. 438/259; 438/270; 438/271; 438/589; 438/149; 438/479; 438/517; 438/221; 438/296; 438/353

(58) Field of Classification Search ................ 438/259, 438/270, 271, 589, 149, 479, 517, 221, 296, 438/353, 319, 421; 257/347
See application file for complete search history.

(56) References Cited

U.S. PATENT DOCUMENTS 5,418,393 A * 5/1995 Hayden .................. 257/347
5,891,763 A * 4/1999 Wanlass .................. 438/149

FOREIGN PATENT DOCUMENTS

JP    11-261068    9/1999

OTHER PUBLICATIONS

"Notice to File Response to a Rejection," from the Korean Intellectual Property Office, corresponding to Korean Patent Application No. 2002-02995, dated Sep. 13, 2004.

* cited by examiner

*Primary Examiner*—Steven Loke
(74) *Attorney, Agent, or Firm*—Myers Bigel Sibley & Sajovec

(57) ABSTRACT

Methods of forming a unit cell of a metal oxide semiconductor (MOS) transistor are provided. An integrated circuit substrate is formed. A MOS transistor is formed on the integrated circuit substrate. The MOS transistor has a source region, a drain region and a gate. The gate is between the source region and the drain region. The first and second spaced apart buffer regions are formed beneath the source region and the drain region and between respective ones of the source region and integrated circuit substrate and the drain region and the integrated circuit substrate.

18 Claims, 33 Drawing Sheets

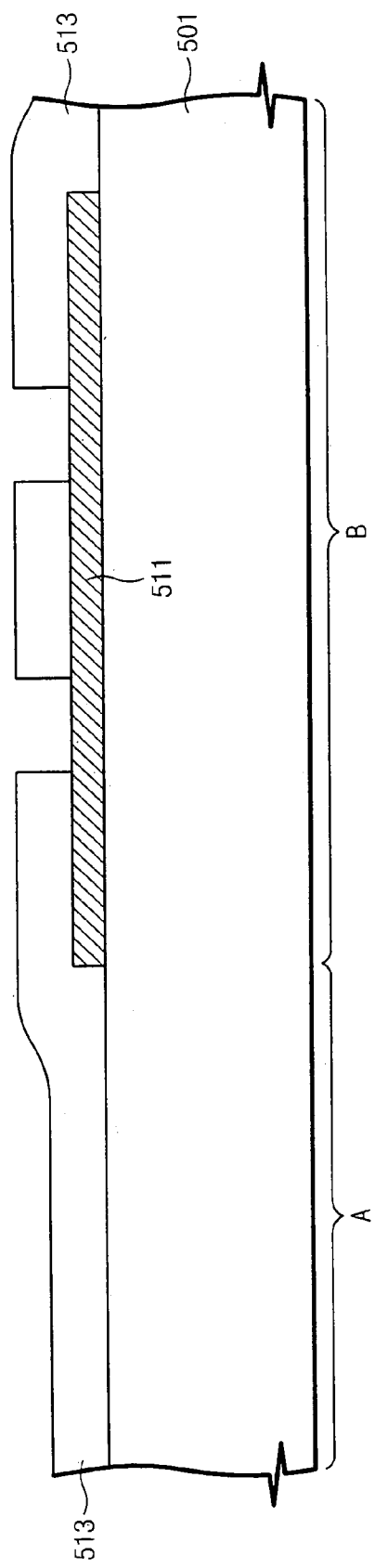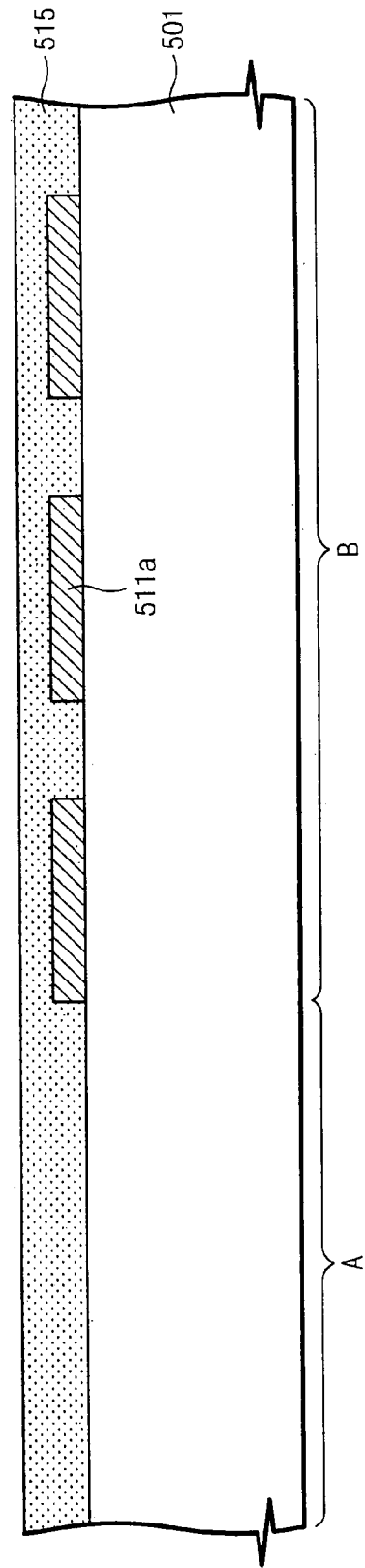

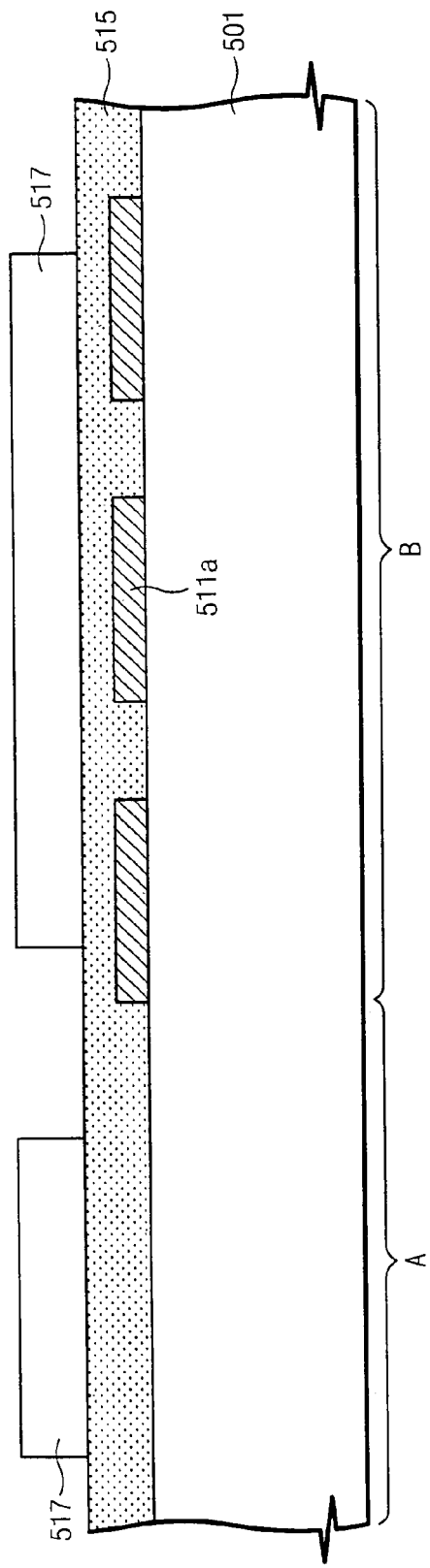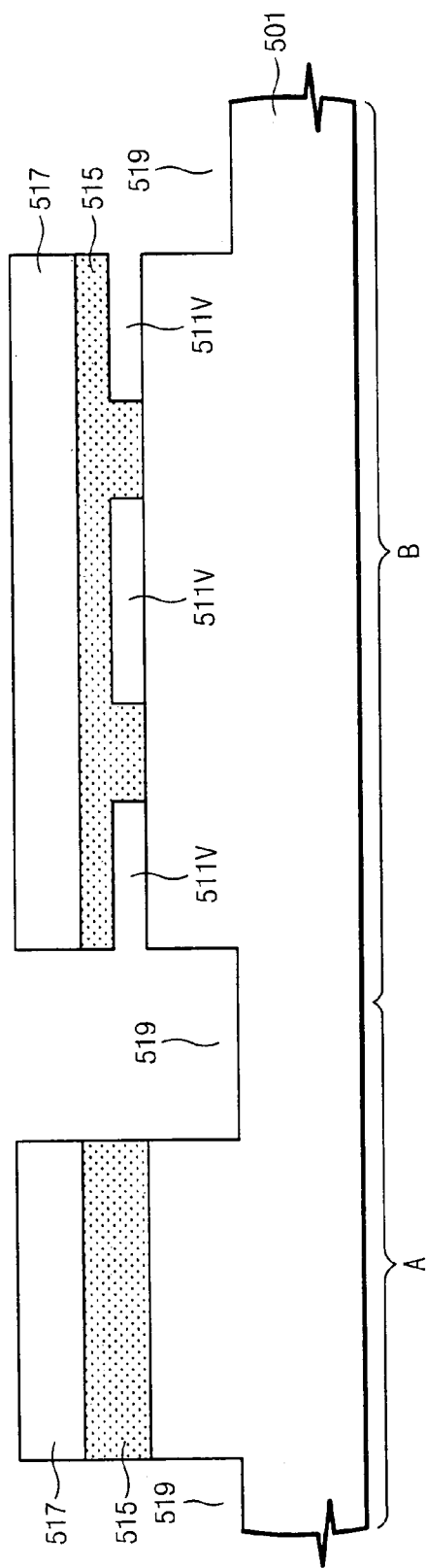

US 7,122,431 B2

METHODS OF FABRICATION METAL OXIDE SEMICONDUCTOR (MOS) TRANSISTORS HAVING BUFFER REGIONS BELOW SOURCE AND DRAIN REGIONS

RELATED APPLICATION

This application is related to and claims priority from Korean Patent Application No. 2003-2995, filed on Jan. 16, 2003 and Korean Patent Application No. 2003-79861 filed Nov. 12, 2003, the disclosures of which are hereby incorporated herein by reference as if set forth in their entirety.

FIELD OF THE INVENTION

The present invention relates to integrated circuit devices and methods of fabricating the same and, more particularly, to metal oxide semiconductor (MOS) transistors and methods of fabricating the same.

BACKGROUND OF THE INVENTION

As integrated circuit devices become more highly integrated, the overall size of metal oxide semiconductor (MOS) transistors have become smaller and channel lengths of the MOS transistors have also been reduced. Accordingly, short channel MOS transistors may experience a punch-through phenomenon that may cause large leakage currents between source and drain regions of the transistor. In addition, source and drain junction capacitances and gate capacitances may also increase. Thus, it may be difficult to provide high performance, low power integrated circuit devices.

To address the problems with MOS transistors discussed above, a silicon on insulator (SOI), technology using a SOI substrate has been introduced. A SOI substrate typically includes a supporting substrate, an insulating layer on the supporting substrate and a silicon layer on the insulating layer. SOI devices may provide low junction leakage currents, reduction in frequency of punch-through, low operation voltage and high efficiency in device isolation. However, heat generated from SOI devices during operation may not be efficiently conducted to the supporting substrate due to the insulating layer between the supporting substrate and the silicon layer. Accordingly, temperatures of SOI devices may increase and thereby degrade the overall characteristics of the device. Furthermore, SOI devices may suffer experience a floating body effect that may cause a parasitic bipolar transistor action. and complex manufacturing techniques may be required in order to remove the floating body effect. Accordingly, improved integrated circuit devices and methods of fabricating integrated circuit devices may be desired.

SUMMARY OF THE INVENTION

Embodiments of the present invention provide a unit cell of a metal oxide semiconductor (MOS) transistor including an integrated circuit substrate and a MOS transistor on the integrated circuit substrate. The MOS transistor has a source region, a drain region and a gate. The gate is between the source region and the drain region. First and second spaced apart buffer regions are provided beneath the source region and the drain region and between respective ones of the source region and integrated circuit substrate and the drain region and the integrated circuit substrate.

In some embodiments of the present invention, a channel region may be provided beneath the gate and between the source and drain regions. The first and second buffer regions may be defined by the channel region and respective ones of the source and drain regions. In certain embodiments of the present invention, floors of the first and second buffer regions may be substantially level with a bottom surface of the channel region and the floors of the first and second buffer regions may be lower than bottom surfaces of the source and drain regions.

In further embodiments of the present invention, the gate may include a gate electrode on the channel region and a capping layer on the gate electrode. The bottom surface of the gate electrode may be lower than top surfaces of the source and the drain regions. In certain embodiments of the present invention, the bottom surface of the gate electrode may be substantially level with floors of the first and second buffer regions. Furthermore, a bottom surface of the channel region may be lower than the floors of the first and second buffer regions.

In still further embodiments of the present invention, the gate may include a gate electrode on the channel region and a capping layer on the gate electrode. The bottom surface of the gate electrode may be lower than floors of the first and second buffer regions. In certain embodiments of the present invention, a bottom surface of the channel region may be lower than the floors of the first and second buffer regions. The buffer region may include air, oxide and/or nitride.

In some embodiments of the present invention, the first buffer region may extend away from the source region towards the gate and extends beneath the gate. Similarly, the second buffer region may extend away from the drain region toward the gate and extends beneath the gate. In certain embodiments of the present invention, an epitaxial layer may be provided on the first and second buffer regions and the integrated circuit substrate. The epitaxial layer may contact the integrated circuit substrate between the first and second buffer regions. A diffusion layer may be provided on the first and second buffer regions and may be absent from the portion of the epitaxial layer that contacts the integrated circuit substrate between the first and second buffer regions.

While the present invention is described above primarily with reference to MOS transistors, methods of fabricating MOS transistors are also provided herein.

BRIEF DESCRIPTION OF THE DRAWINGS

FIGS. 5A to 14A, FIGS. 5B to 14B, and FIGS. 5C to 14C are cross sections taken along the lines 1A–1A', 1B–1B' and 1C–1C' of FIG. 1, respectively, illustrating processing steps in the fabrication of MOS transistors according to embodiments of the present invention illustrated in FIGS. 2A to 2C.

FIGS. 15A to 17A, FIGS. 15B to 17B, and FIGS. 15C to 17C are cross sections taken along the lines 1A–1A', 1B–1B' and 1C–1C' of FIG. 1, respectively, illustrating processing steps in the fabrication of sacrificial layer patterns according to further embodiments of the present invention illustrated in FIGS. 6A and 6B.

FIGS. 25 to 34 are cross sections illustrating processing steps in the fabrication of MOS transistors according to still further embodiments of the present invention.

DETAILED DESCRIPTION

Figure 1:
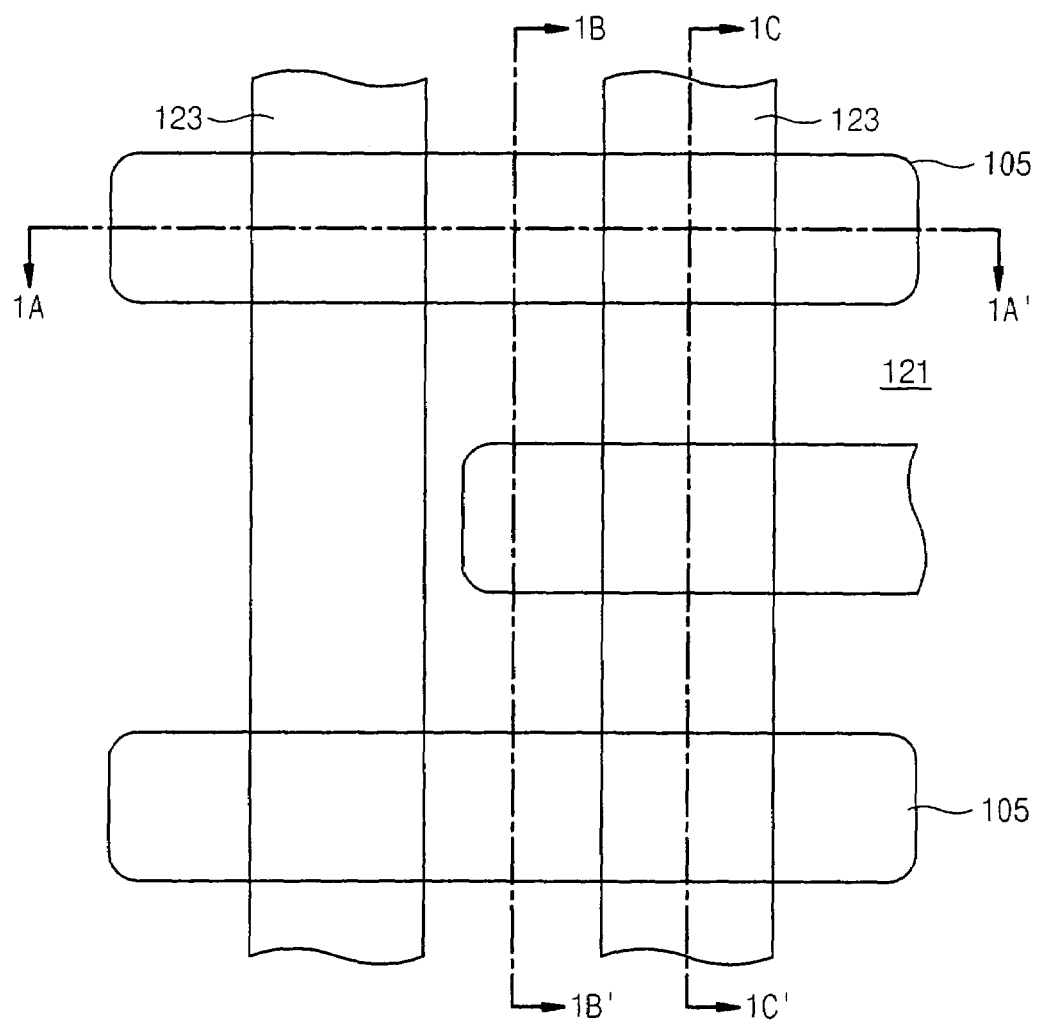
FIG. 1 is a top plan view of metal oxide semiconductor (MOS) transistors according to some embodiments of the present invention.

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, the thickness of layers and regions are exaggerated for clarity. It will be understood that when an element such as a layer, region or substrate is referred to as being "on" another element, it can be directly on the other element or intervening elements may also be present. It will be understood that when an element such as a layer, region or substrate is referred to as "under" or "beneath" another element, it can be directly under the other element or intervening elements may also be present. It will be understood that when part of an element is referred to as "outer," it is closer to the outside of the integrated circuit than other parts of the element. Like numbers refer to like elements throughout.

Furthermore, relative terms, such as beneath, may be used herein to describe an element's relationship to another as illustrated in the Figures. It will be understood that these terms are intended to encompass different orientations of the elements in addition to the orientation depicted in the Figures. For example, if a Figure is inverted, the elements described as "beneath" other elements would be oriented "above" these other elements. The relative terms are, therefore, intended to encompass all possible arrangements of the elements and not just the ones shown in the Figures.

It will be understood that although the terms first and second are used herein to describe various regions, layers and/or sections, these regions, layers and/or sections should not be limited by these terms. These terms are only used to distinguish one region, layer or section from another region, layer or section. Thus, a first region, layer or section discussed below could be termed a second region, layer or section, and similarly, a second region, layer or section may be termed a first region, layer or section without departing from the teachings of the present invention.

Embodiments of the present invention will be described below with respect to FIGS. 1 through 34. Embodiments of the present invention provide a metal oxide semiconductor (MOS) transistor on an integrated circuit substrate having a source region, a drain region and a gate. The gate of the MOS transistor being between the source region and the drain region. First and second spaced apart buffer regions are provided beneath the source region and the drain region and between respective ones of the source region and integrated circuit substrate and the drain region and the integrated circuit substrate. The presence of the first and second spaced apart buffer regions may possibly reduce the junction capacitance and the junction leakage current of the source/drain regions. Furthermore, the channel regions may be formed to be lower than bottom surfaces of the source/drain regions, which may suppress the short channel effect of the MOS transistor as discussed further below.

Referring now to FIG. 1, a top plan view illustrating MOS transistors according to some embodiments of the invention will be discussed. As illustrated, first and second bar-shaped active regions 105 are spaced apart on an integrated circuit substrate. An isolation layer 121 is provided between the first and second active regions on the integrated circuit substrate. A plurality of gate lines 123 are provided on the active regions 105 and the isolation layer 121. It will be understood that embodiments of the present invention illustrated in FIG. 1 are provided for exemplary purposes only and embodiments of the present invention are not limited to this configuration. For example, the active regions 105 may not be bar-shaped and may have a different configuration without departing from the scope of the present invention.

Figure 2A:
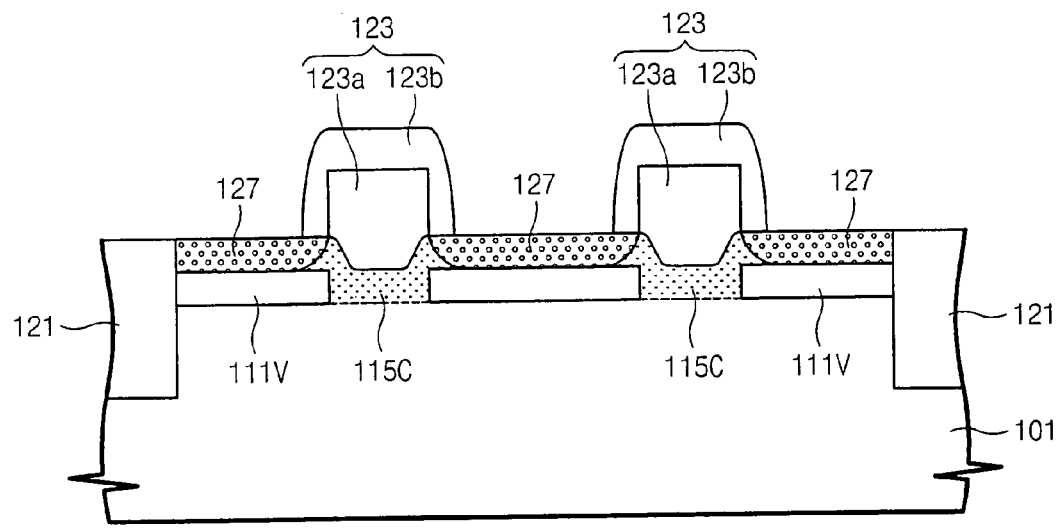
FIGS. 2A to 2C are cross-sections of MOS transistors according to some embodiments of the present invention taken along the lines 1A–1A', 1B–1B' and 1C–1C' of FIG. 1, respectively.
Figure 2B:
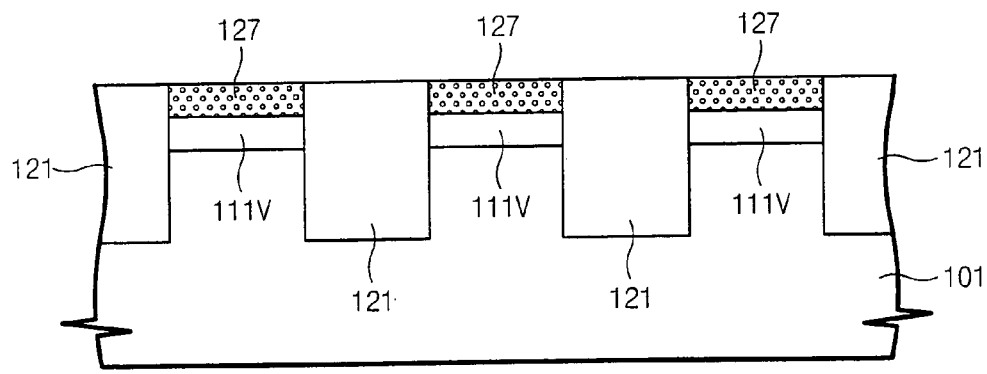
Figure 2C:
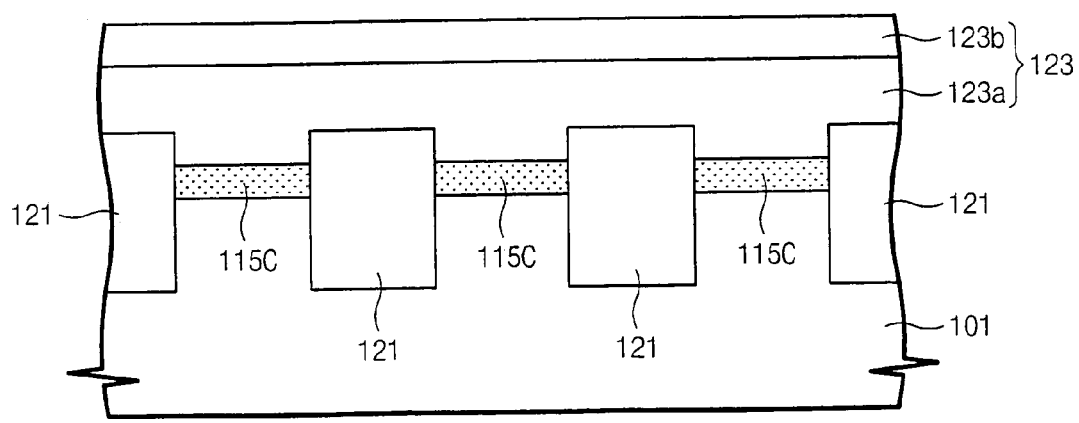

Referring now to FIGS. 2A to 2C, cross sections taken along the lines 1A–1A', 1B–1B' and 1C–1C' of FIG. 1, respectively, illustrating processing steps in the fabrication of MOS transistors according to some embodiments of the invention will be discussed. As illustrated, buffer regions 111V are spaced apart from one another on the integrated circuit substrate 101. The buffer regions 111V may be empty regions or may include an oxide layer and a nitride liner on the oxide layer. The buffer regions 111V contact an isolation layer 121. Junction regions 127, for example, source and/or drain regions are provided on the buffer regions 111V. As a result, the buffer regions 111V are provided beneath the source region and/or the drain region (the junction regions 127) and between respective ones of the source region and integrated circuit substrate and the drain region and the integrated circuit substrate. Accordingly, the junction capacitance between the junction regions 127 and the integrated circuit substrate 101 may be reduced due to the presence of the buffer regions 111V. Furthermore, the junction regions 127 may include a lightly doped drain (LDD) region in order to improve the short channel effect.

Channel regions 115C are provided between the buffer regions 111V and between the junctions regions 127 as illustrated in FIG. 2A. In certain embodiments of the present invention, bottom surfaces of the channel regions 115C may be substantially planar with floors of the buffer regions 111V and may be lower than bottom surfaces of the junction regions 127. In some embodiments of the present invention, the junction regions 127 and the channel regions 115C are formed in an epitaxial layer as discussed further below.

The integrated circuit substrate 101 may be, for example, a silicon substrate or a silicon germanium substrate. In embodiments of the present invention having a silicon substrate, the junction regions 127 and the channel regions 115C are formed in an epitaxial layer including silicon. In further embodiments of the present invention having a silicon germanium substrate, the junction regions 127 and the channel regions 115C are formed in an epitaxial layer including silicon germanium.

Gate stacks (or gate lines) 123 are provided on the channel regions 115C. The gate stacks 123 may include a gate electrode 123a and a capping layer 123b on the gate electrode 123a. The capping layer 123b may further include a gate spacer covering sidewalls of the gate electrode 123a. In some embodiments of the present invention, bottom surfaces of the gate electrodes 123a are lower than upper surfaces of the junction regions 127. Thus, MOS transistors according to embodiments of the present invention may have an improved short channel characteristic. A gate insulation layer (not shown) may be provided between the gate electrodes 123a and the channel regions 115C.

In some embodiments of the present invention, the gate electrodes 123a include polysilicon. In further embodiments of the present invention, the gate electrodes 123a may also include a metal layer such as a tungsten layer or a metal silicide layer such as a tungsten silicide layer in order to possibly reduce the resistance of the gate electrodes 123a. Similarly, a metal silicide layer (not shown) may be provided on the junction regions 127 in order to possibly reduce source/drain resistance of the MOS transistors The junction regions 127 (source and drain regions), the gate electrodes 123a and the channel regions 115C constitute a MOS transistor. In other words, the MOS transistor includes a source region, a drain region and a gate between the source region and the drain region. The MOS transistor(s) are provided on active regions defined by the isolation layer 121.

Figure 3A:
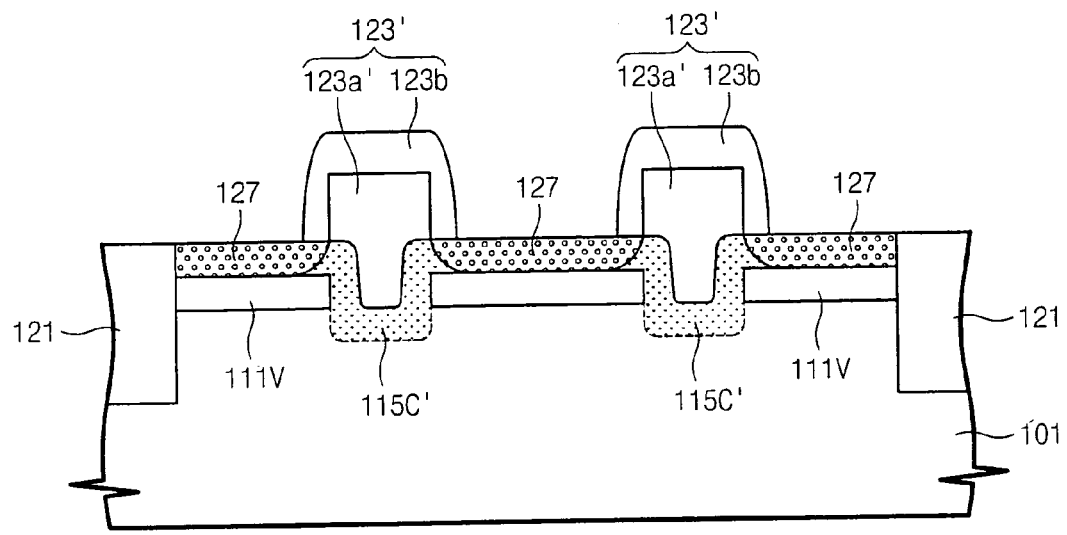
FIGS. 3A to 3C are cross sections of MOS transistors according to further embodiments of the present invention taken along the lines 1A–1A', 1B–1B' and 1C–1C' of FIG. 1, respectively.
Figure 3B:
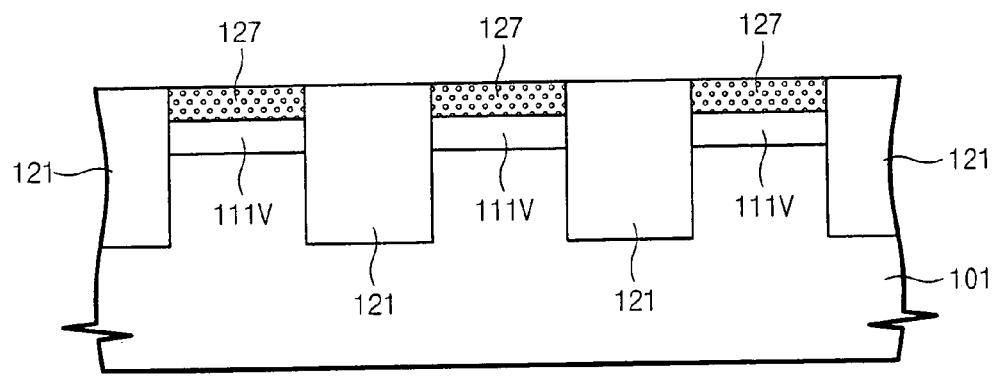
Figure 3C:
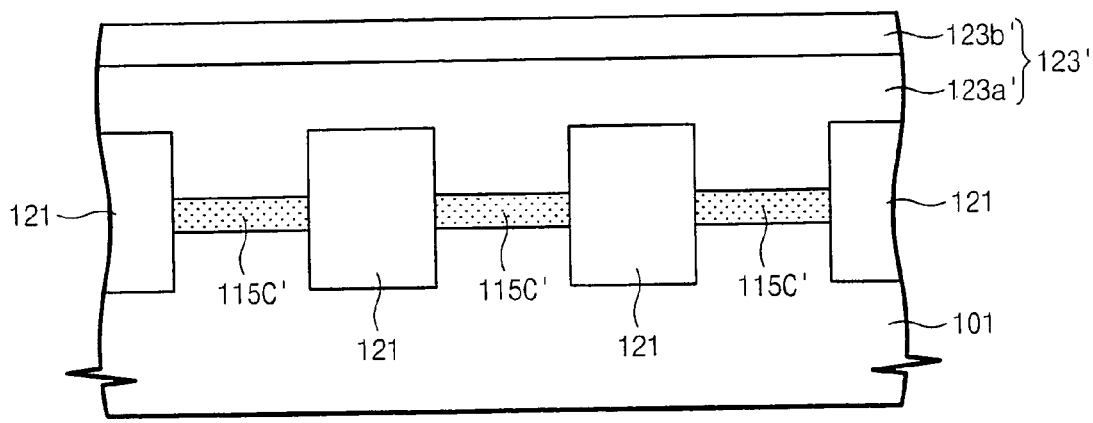

Referring now to FIGS. 3A to 3C, cross sections taken along the lines 1A–1A', 1B–1B', and 1C–1C' of FIG. 1, respectively, illustrating processing steps in the fabrication of MOS transistors according further embodiments of the invention will be discussed. Reference numerals corresponding to elements discussed with respect to FIG. 1 refer to like elements with respect to FIG. 2. Thus, the details with respect to these like elements will not be discussed further herein.

As illustrated in FIGS. 3A to 3C, bottom surfaces of the gate electrodes 123a' are substantially planar with the floors of the buffer regions 111V. Therefore, the bottom surfaces of the channel regions 115C' are lower than the bottom surfaces of the buffer regions 111V. In other words, embodiments of the present invention illustrated in FIGS. 3A to 3C include channel regions 115C' and gate electrodes 123a' that are recessed further into the integrated circuit substrate 101 compared to embodiments of the present invention illustrated in FIGS. 2A to 2C. Thus, it may be possible to further increase the channel length according to embodiments of the present invention illustrated in FIGS. 3A to 3C. The capping layer 123b may be provided on the gate electrodes 123' as illustrated in FIGS. 3A and 3C. The gate electrodes 123a' and the capping layers 123b constitute a gate stack (or a gate line) 123'.

Figure 4A:
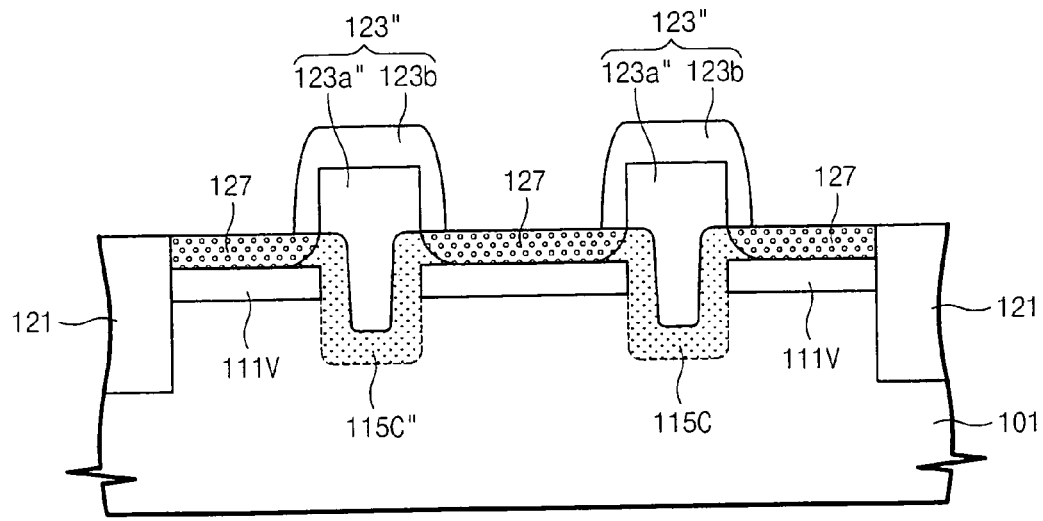
FIGS. 4A to 4C are cross sections of MOS transistors according to still further embodiments of the present invention taken along the lines 1A–1A', 1B–1B' and 1C–1C' of FIG. 1, respectively.
Figure 4B:
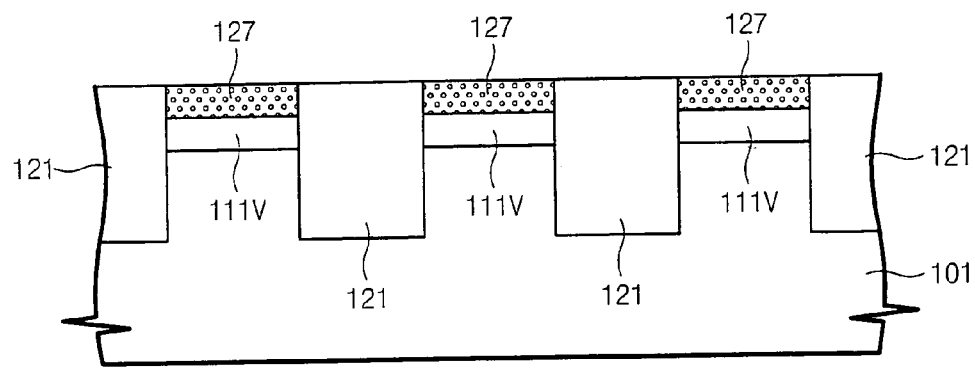
Figure 4C:
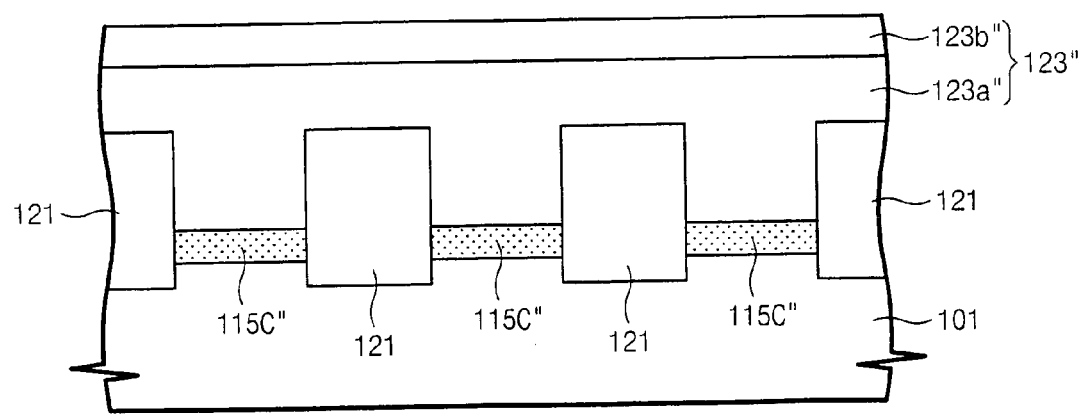

Referring now to FIGS. 4A to 4C, cross sections taken along the lines 1A–1A', 1B–1B', and 1C–1C' of FIG. 1, respectively, illustrating processing steps in the fabrication of MOS transistors according still further embodiments of the invention will be discussed. Reference numerals corresponding to elements discussed with respect to FIGS. 1 and 2 refer to like elements with respect to FIG. 3. Thus, the details with respect to these like elements will not be discussed further herein.

As illustrated in FIGS. 4A to 4C, bottom surfaces of the gate electrodes 123a'' are provided to be lower than floors of the buffer regions 111V. Therefore, the bottom surfaces of channel regions 115C'' are lower than the floors of the buffer regions 111V. In other words, embodiments of the present invention include channel regions 115C'' and gate electrodes 123a'' that are recessed further into the integrated circuit substrate than embodiments of the present invention illustrated in FIGS. 2A to 2C and 3A to 3C. Thus, it may be possible to further increase the channel length of MOS transistors according to embodiments of the present invention. The capping layer 123b is provided on the gate electrodes 123a'' as illustrated in FIGS. 4A and 4C. The gate electrodes 123a'' and the capping layers 123b constitute a gate stack (or a gate line) 123''.

Figure 5A:
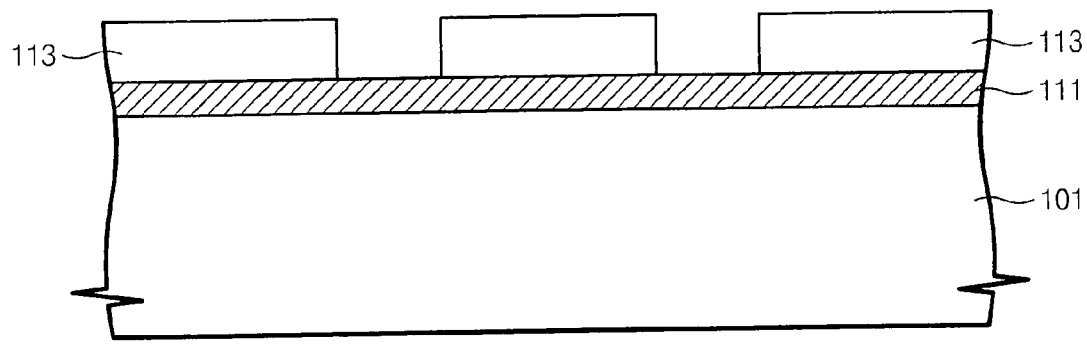
Figure 5B:
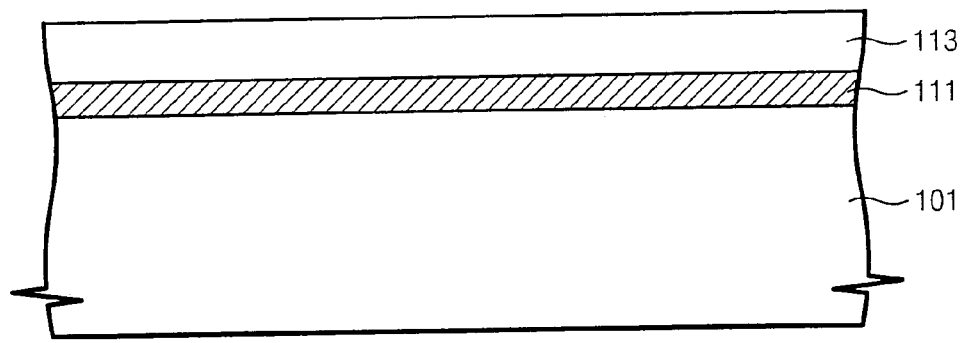
Figure 5C:
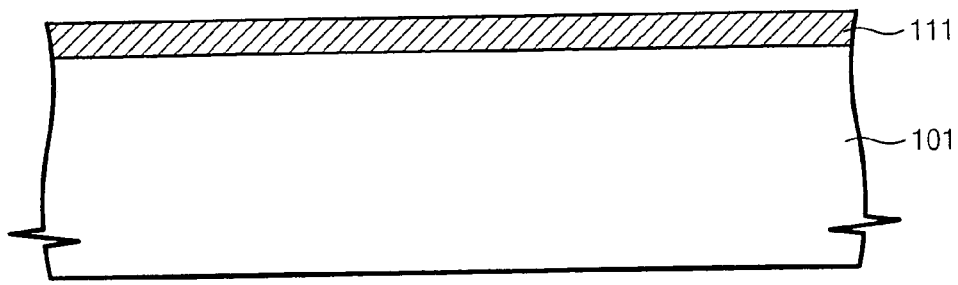

Processing steps in the fabrication of MOS transistors according embodiments of the present invention will now be discussed with respect to FIGS. 5A through 34. Referring now to FIGS. 5A to 14A, FIGS. 5B to 14B and FIGS. 5C to 14C, cross sections illustrating processing steps in the fabrication of MOS transistors according to embodiments of the present invention illustrated in FIGS. 2A to 2C will be discussed. As illustrated in FIGS. 5A, 5B and 5C, a sacrificial layer 111 is formed on a substrate 101. The substrate 101 may include, for example, silicon. In these embodiments, the sacrificial layer 111 may include a silicon germanium (Si—Ge) layer having an etch selectivity with respect to the silicon substrate. The Si—Ge layer may be formed using, for example, an epitaxial growth technique in order to obtain a single crystalline Si—Ge layer.

A photoresist pattern 113 is formed on the epitaxial sacrificial layer 111. The photoresist pattern 113 may be formed using, for example, a photolithography technique. The photoresist pattern 113 is provided on junction regions, the formation of which will be discussed further below. A protection layer (116 of FIG. 24) may be additionally formed on the epitaxial sacrificial layer 111 prior to formation of the photoresist pattern 113. The protection layer may include the same or similar material layer as an epitaxial layer to be formed in a subsequent process.

Figure 6A:
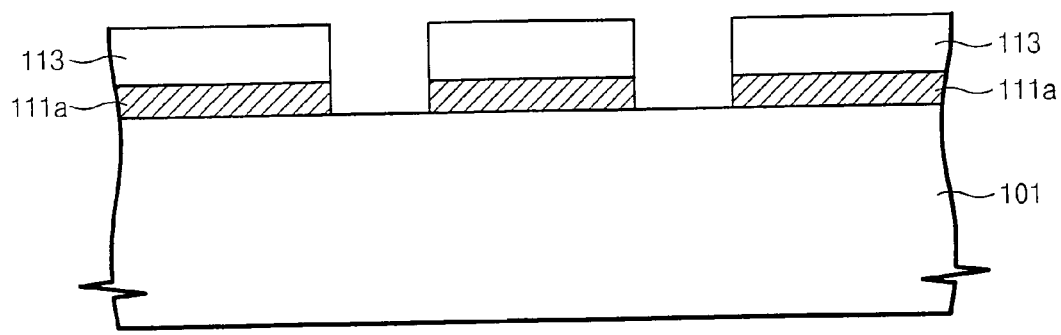
Figure 6B:
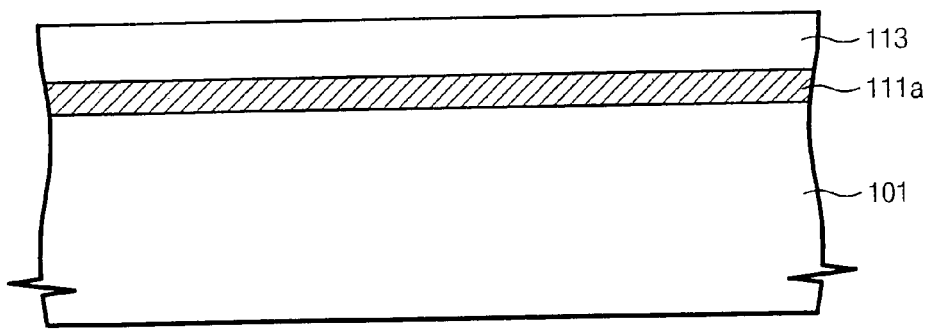
Figure 6C:
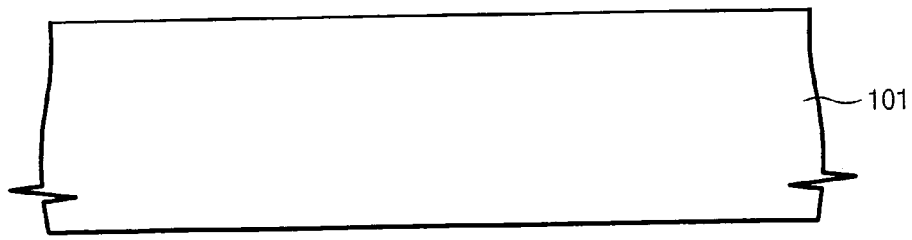

Referring now to FIGS. 6A, 6B and 6C, the epitaxial sacrificial layer 111 is etched using, for example, the photoresist pattern 113 as an etch mask to expose at least a portion of the integrated circuit substrate 101. Accordingly, sacrificial layer patterns 111a are formed on the integrated circuit substrate 101 and are spaced apart from one another. In some embodiments of the present invention, a protection layer (not shown) is formed on the sacrificial layer 111. In these embodiments of the present invention, the protection layer is etched before the sacrificial layer 111. Thus, protection layer patterns may also be formed on the sacrificial layer patterns 111a. Junction regions, the formation of which will be discussed below, may be formed in the protection layer patterns according to embodiments of the present invention including the protection layer.

Figure 7A:
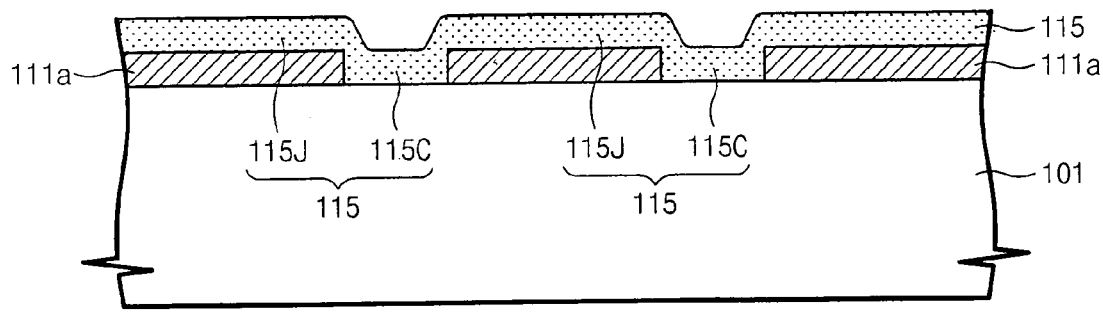
Figure 7B:
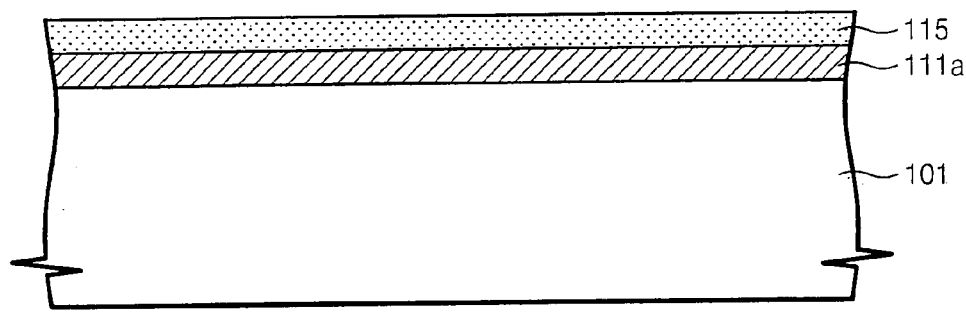
Figure 7C:
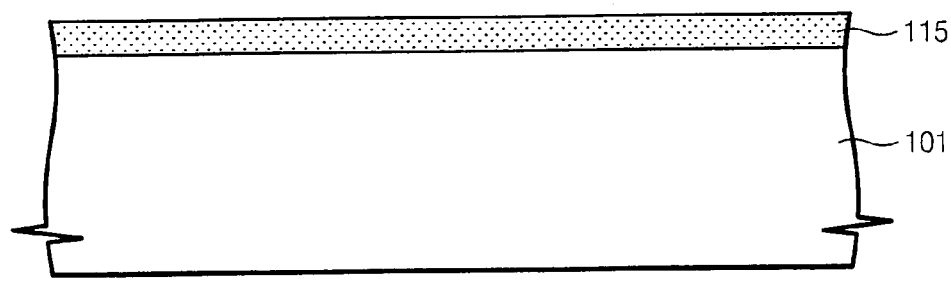

Referring now to FIGS. 7A, 7B and 7C, the photoresist pattern 113 is removed and an epitaxial layer 115 is formed on a surface of the substrate and on the sacrificial layer patterns 111a. The epitaxial layer 115 may include a single crystalline semiconductor layer having an etch selectivity with respect to the sacrificial layer patterns 111a. For example, the epitaxial layer 115 may include an epitaxial silicon layer having an etch selectivity with respect to the Si—Ge layer. The epitaxial layer 115 includes channel regions 115C between the adjacent sacrificial layer patterns 111a and junction regions 115J over the sacrificial layer patterns 111a. A thickness of the epitaxial silicon layer 115 may be determined based on depths of the junction regions. Accordingly, the junction depth may be controlled to provide desired characteristics of the MOS transistor. The epitaxial layer 115 may be conformably formed as illustrated in FIG. 7A. However, in some embodiments of the present invention, the epitaxial layer 115 may be formed to have a flat top surface.

Figure 8A:
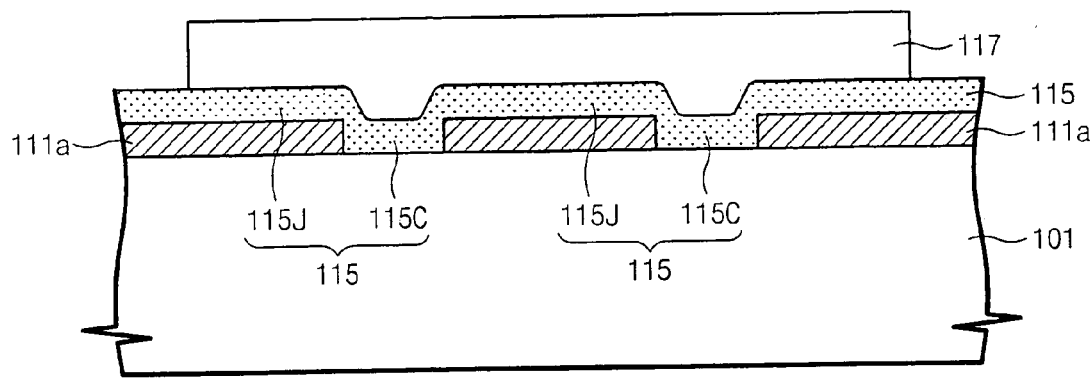
Figure 8B:
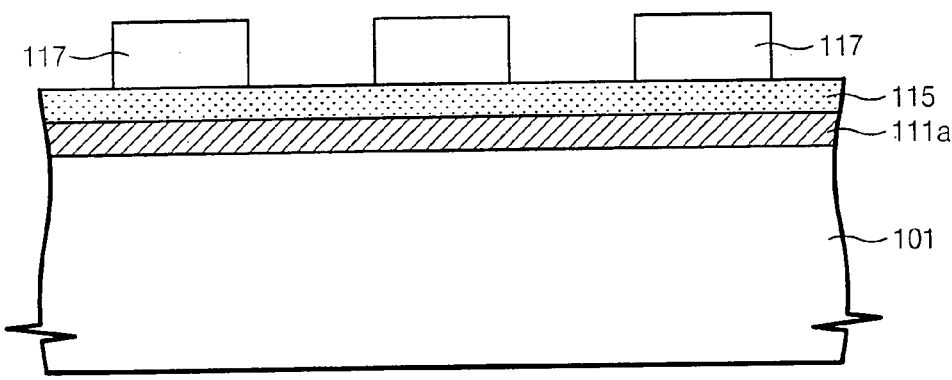
Figure 8C:
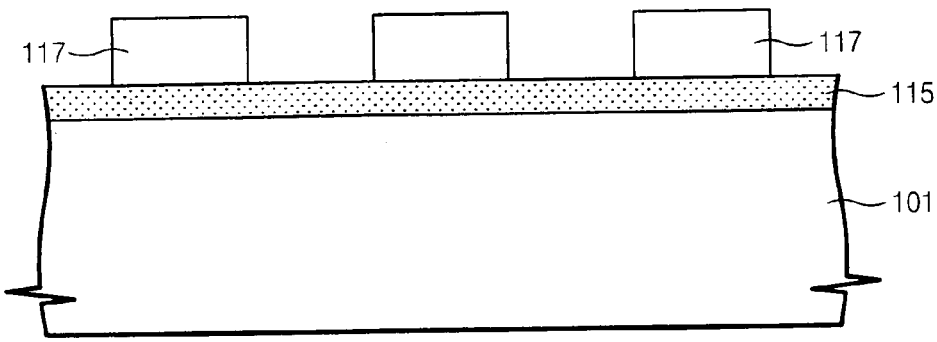

Referring now to FIGS. 8A, 8B and 8C, an etch mask pattern 117 is formed on the epitaxial layer 115 to define an active region. In other words, the etch mask pattern 117 is formed on the active region. The etch mask pattern 117 may include a pad oxide layer and a mask nitride layer. The pad oxide layer may be formed using, for example, a thermal oxidation technique, and the mask nitride layer may be formed using, for example, a low pressure chemical vapor deposition (LPCVD) technique.

Figure 9A:
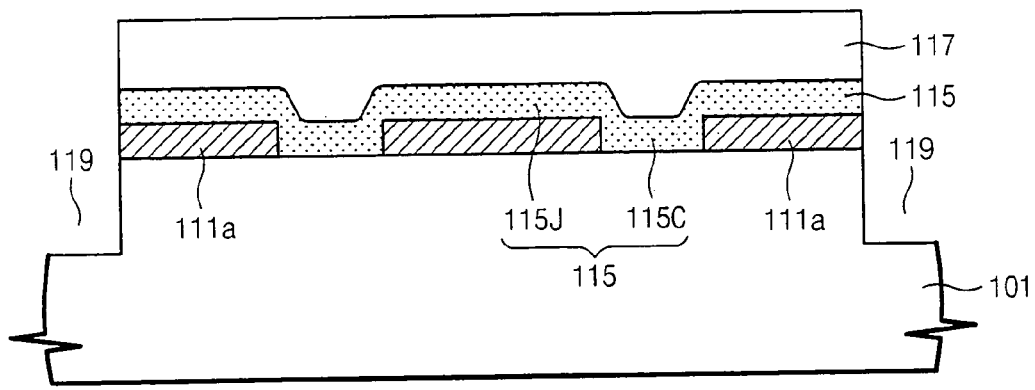
Figure 9B:
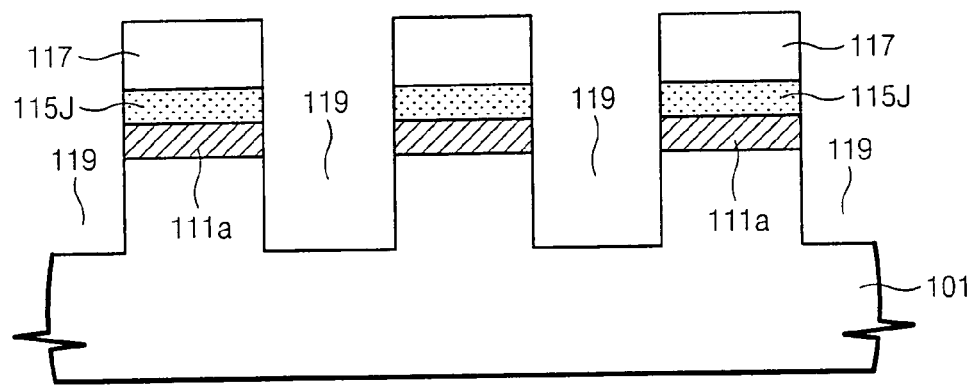
Figure 9C:
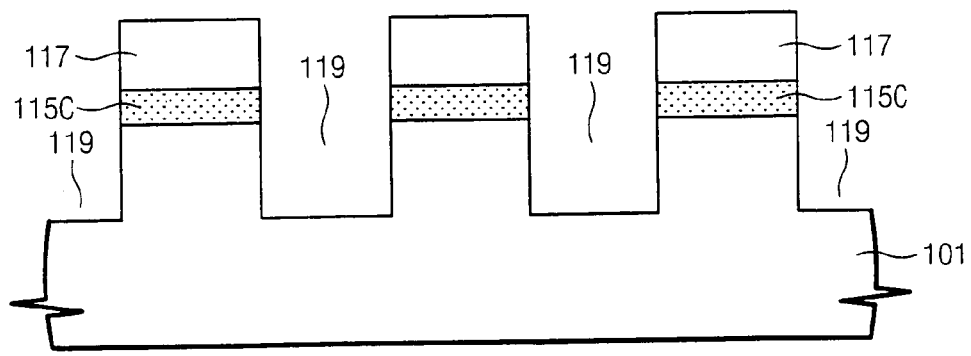

Referring now to FIGS. 9A, 9B and 9C, the epitaxial layer 115, the sacrificial layer patterns 111a and the integrated circuit substrate 101 are etched using the etch mask pattern 117 as an etch mask to form a trench 119 that corresponds to an isolation region. As a result, sidewalls of the etched epitaxial layer 115 and the etched sacrificial layer patterns 111a are exposed by the trench 119.

Figure 10A:
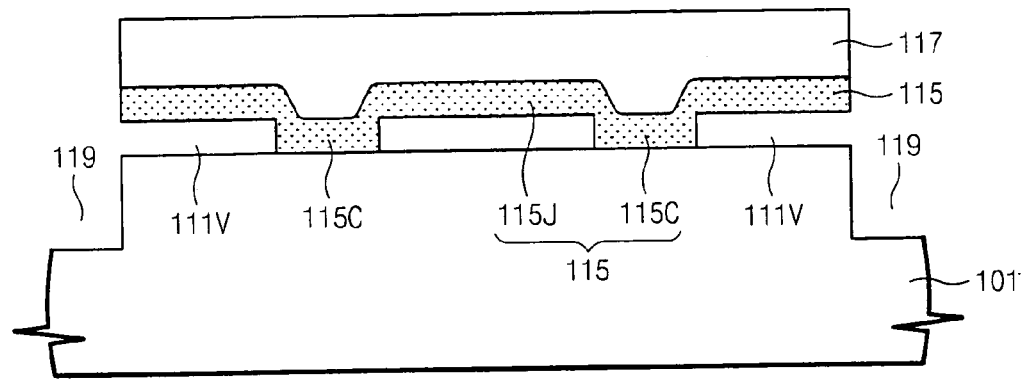
Figure 10B:
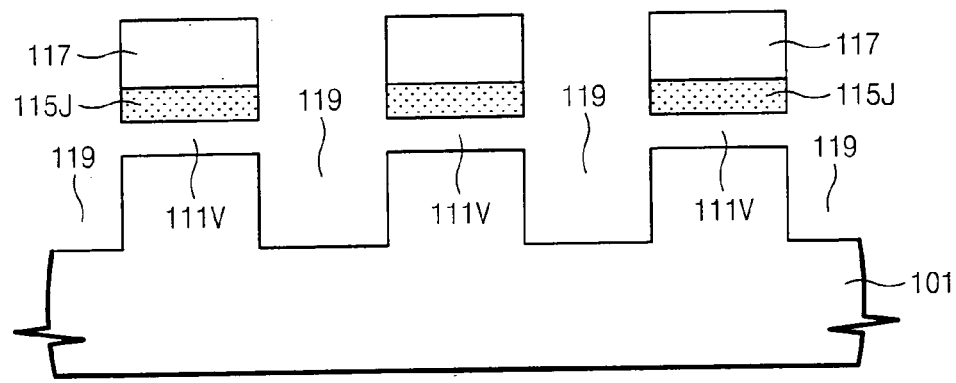
Figure 10C:
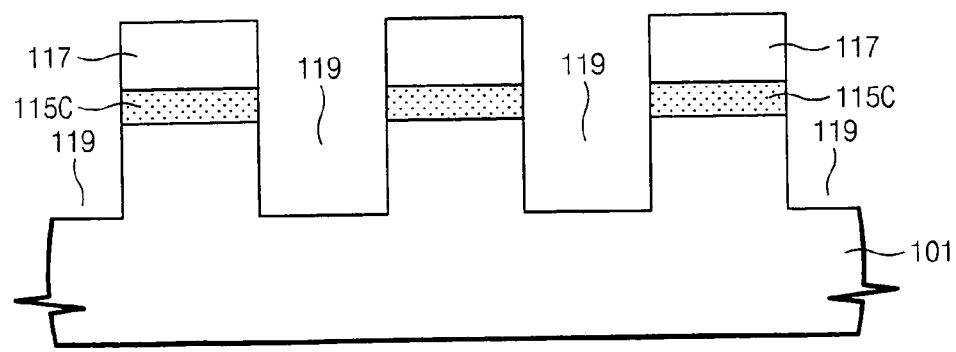

Referring now to FIGS. 10A, 10B and 10C, the sacrificial layer patterns 111a exposed by the trench 119 are selectively removed to form buffer regions 111V. As a result, the buffer regions 111V are branched from the trench 119 as illustrated in FIG. 10A through 10C.

Figure 11A:
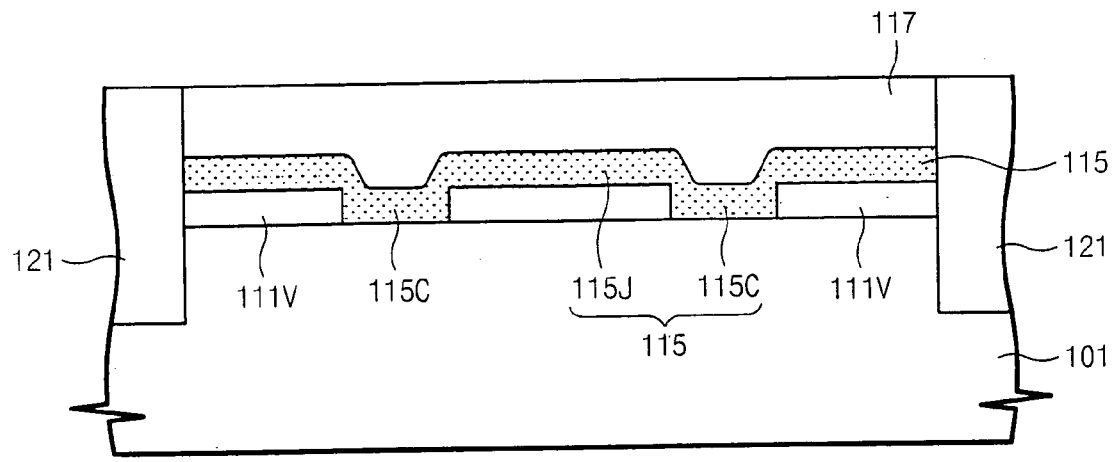
Figure 11B:
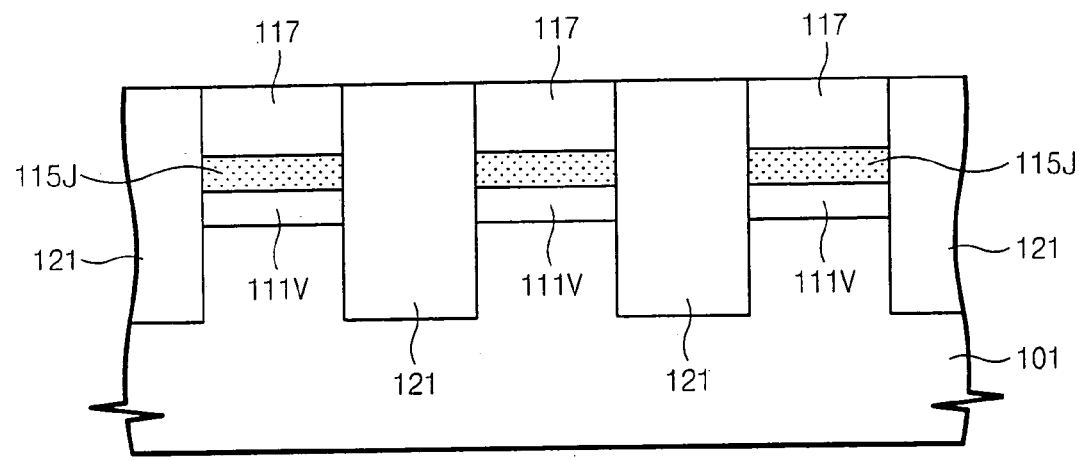
Figure 11C:
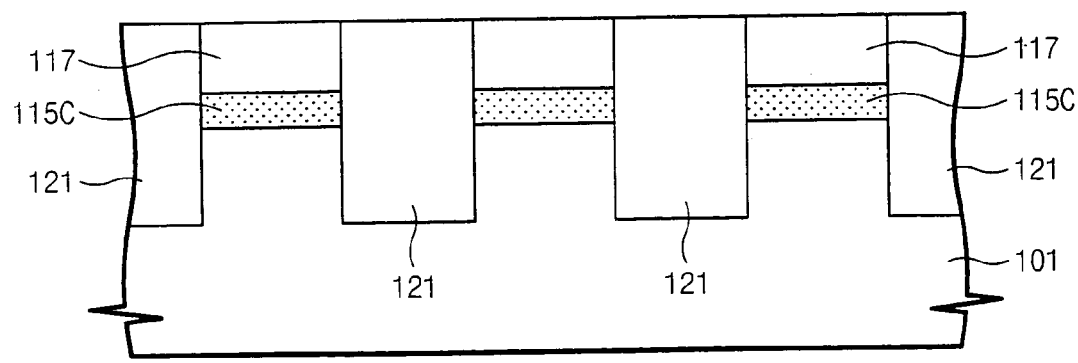
Figure 12A:
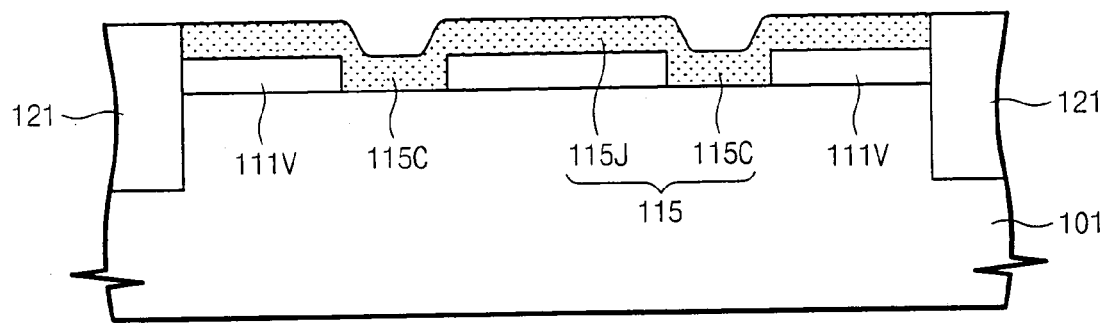
Figure 12B:
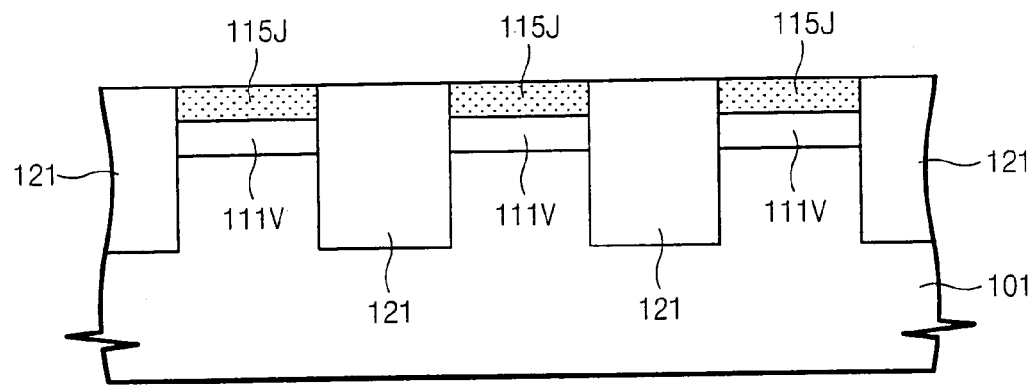
Figure 12C:
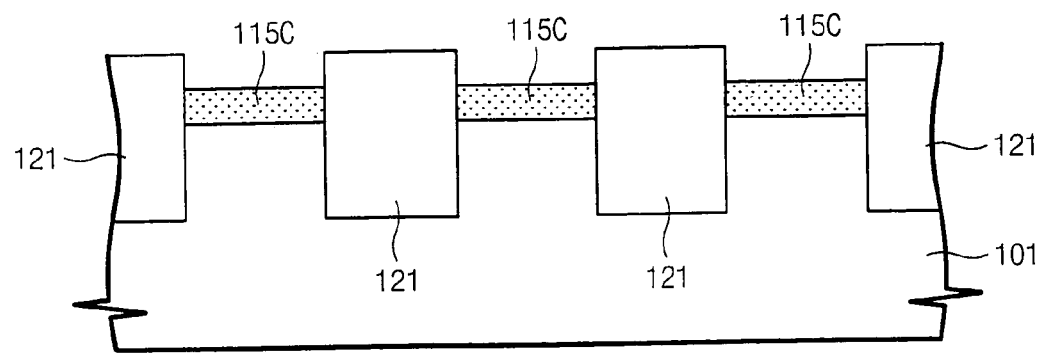
Figure 13A:
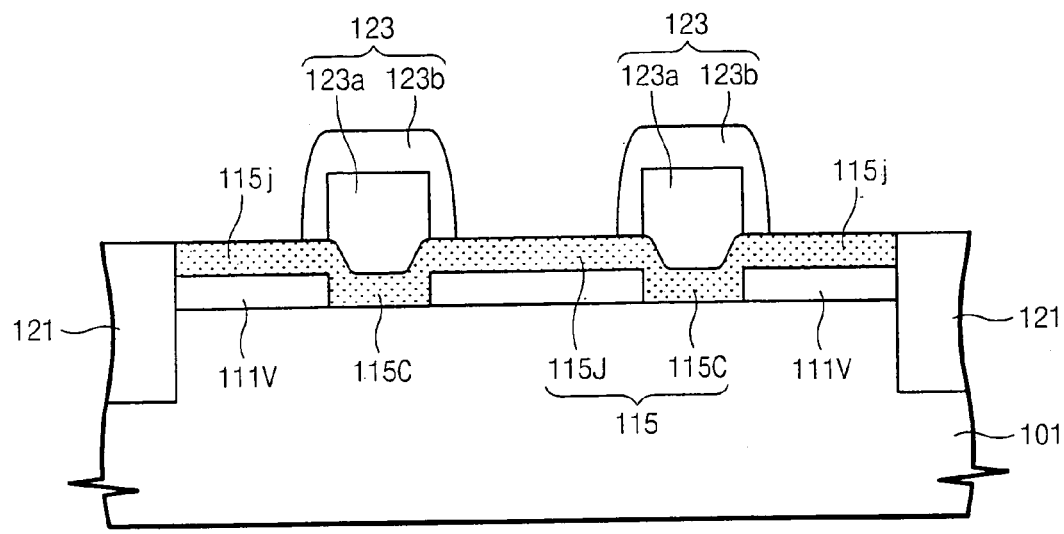
Figure 13B:
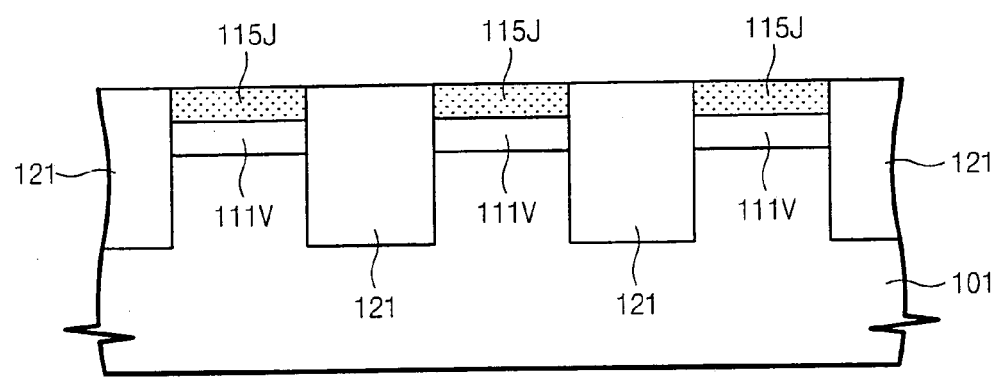
Figure 13C:
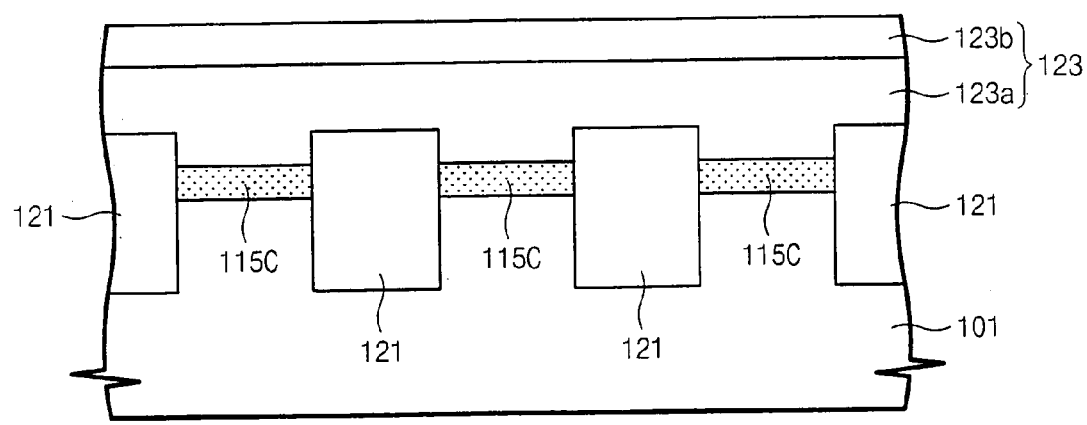

Referring now to FIGS. 11A, 11B and 11C, an insulation layer is formed in the trench 119 and the insulation layer is planarized to expose at least a portion of the etch mask pattern 117 to form an isolation layer 121 in the trench 119. As illustrated in FIGS. 12A, 12B and 12C, the etch mask pattern 117 is removed using a methods known to those having skill in the art and exposing the epitaxial layer 115. A cleaning process is performed to complete an isolation process. As illustrated in FIGS. 13A, 13B and 13C, gate stacks 123 are formed to on the epitaxial layer 115 between the adjacent buffer regions 111V. In other words, the gate stacks 123 cross over the channel regions 115C.

A gate insulation layer (not shown) is formed on the substrate 101, a gate electrode layer is formed on the gate insulation layer and a capping layer is formed on the gate electrode layer. The capping layer, the gate electrode layer and the gate insulation layer are patterned to form gate patterns and sidewall spacers on sidewalls of the gate patterns. Accordingly, the gate stacks 123 include the gate insulation layer on the epitaxial layer 115, a gate electrode 123a on the gate insulation layer and a gate protection layer 123b on the gate electrode 123a. The gate protection layer 123b includes the sidewall spacer on the sidewalls of the gate electrode 123a and the capping layer on an upper surface of the gate electrode 123a. The gate patterns may be used as implantation masks, and impurity ions may be implanted into the epitaxial layer 115 to form lightly doped drain (LDD) regions prior to formation of the sidewall spacers.

Figure 14A:
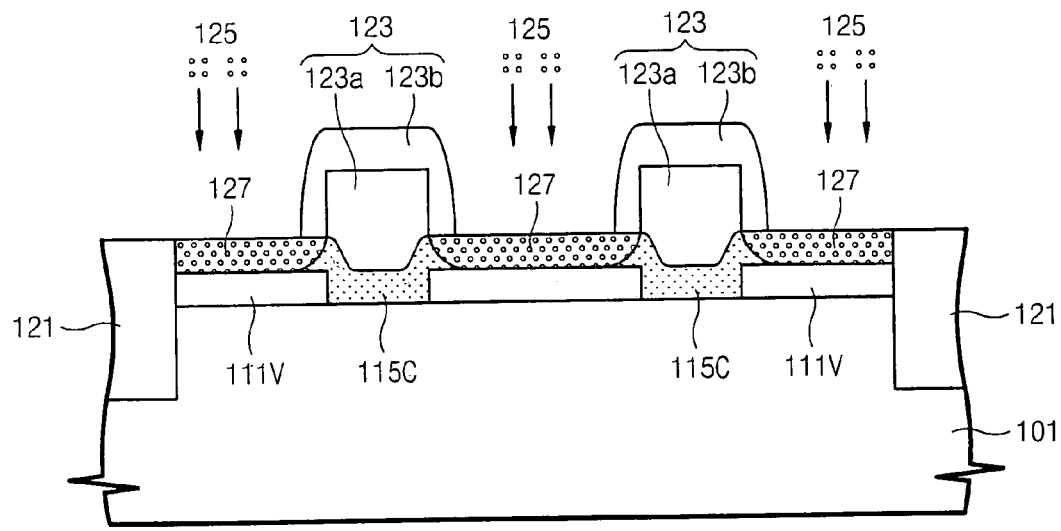
Figure 14B:
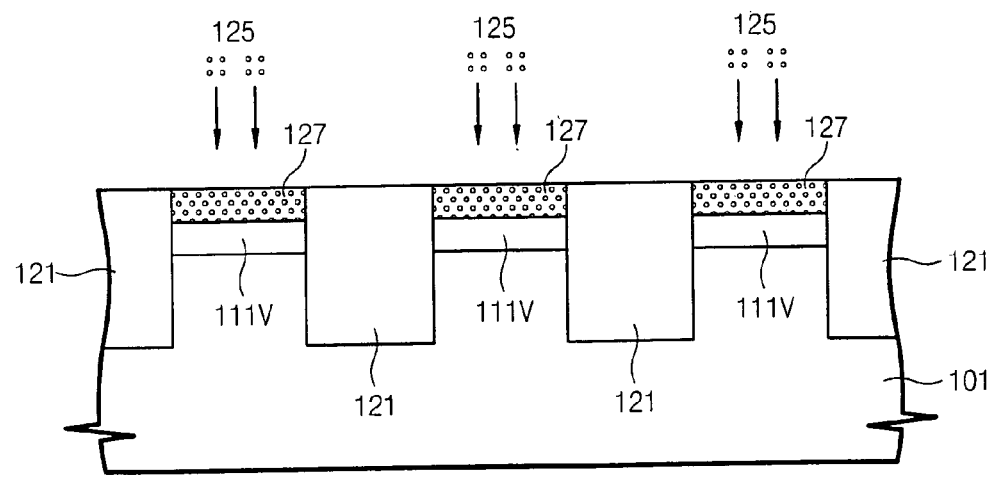
Figure 14C:
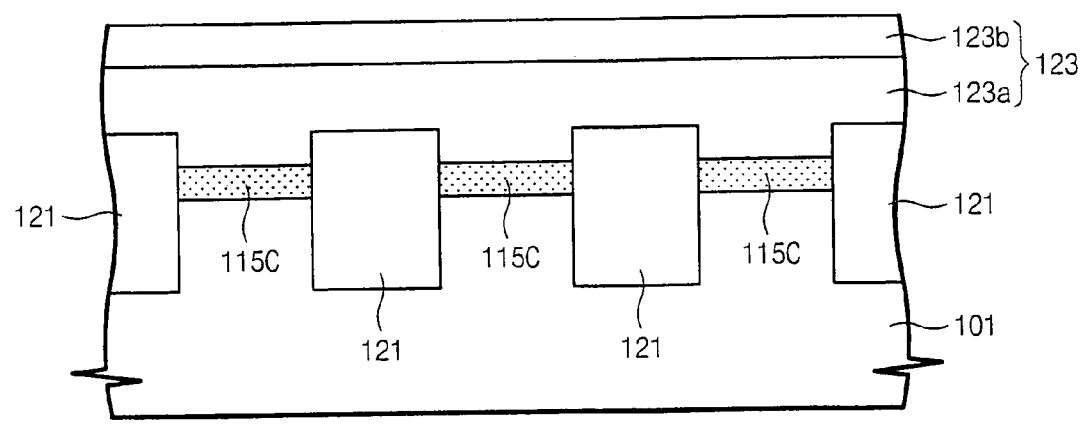

Referring to FIGS. 14A, 14B and 14C, more impurity ions 125 may be implanted into the epitaxial layer 115 using the gate stacks 123 as implantation masks, thereby forming source/drain regions 127 in the junction regions 115J. As illustrated, the junction regions 115J are formed on the buffer regions 111V. Thus, a depth of the source/drain regions 127 may be determined by the thickness of the epitaxial layer 115. Therefore, an appropriate junction depth of the source/drain regions may be controlled by controlling the thickness of the epitaxial layer 115.

In certain embodiments of the present invention, a silicidation process may be performed to form a silicide layer on the junction regions 127. In this case, even though the silicidation process is performed for a relatively long time, the silicide layer may not extend into the substrate due to the presence of the buffer regions 111V under the junction regions 127.

In embodiments of the present invention having silicon germanium substrates, the sacrificial layer 111 may be an epitaxial silicon layer and the epitaxial layer 115 may be an epitaxial silicon germanium layer.

The sacrificial layer patterns 111a may be formed using, for example, a photolithography process and an etching process as described with reference to FIGS. 6A to 6C. However, the sacrificial layer patterns 111a may also be formed using an alternative method, for example, the method illustrated by the cross sections of FIGS. 15A to 17A, FIGS. 15B to 17B and FIGS. 15C to 17C. FIGS. 15A to 17A, 15B to 17B and 15C to 17C are cross sections taken along the lines 1A–1A', 1B–1B' and 1C–1C', respectively, of FIG. 1.

Figure 15A:
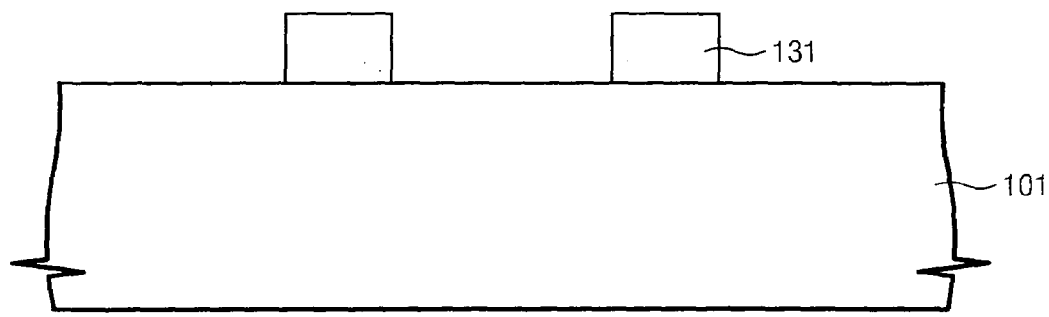
Figure 15B:
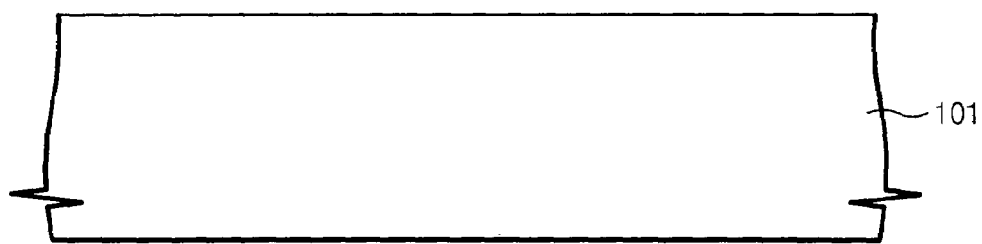
Figure 15C:
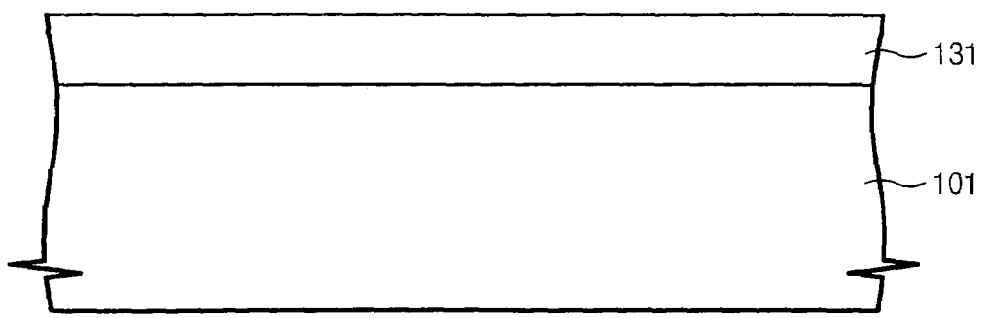

Referring now to FIGS. 15A, 15B and 15C, dummy gate patterns 131, which are spaced apart from each other, are formed on an integrated circuit substrate 101, for example, a silicon substrate. The dummy gate patterns 131 are formed of an insulating layer such as an oxide layer or a nitride layer. The dummy gate patterns 131 may be formed using, for example, a photolithography and etching processes. The dummy gate patterns 131 provide places where gate stacks are formed in a subsequent process.

Figure 16A:
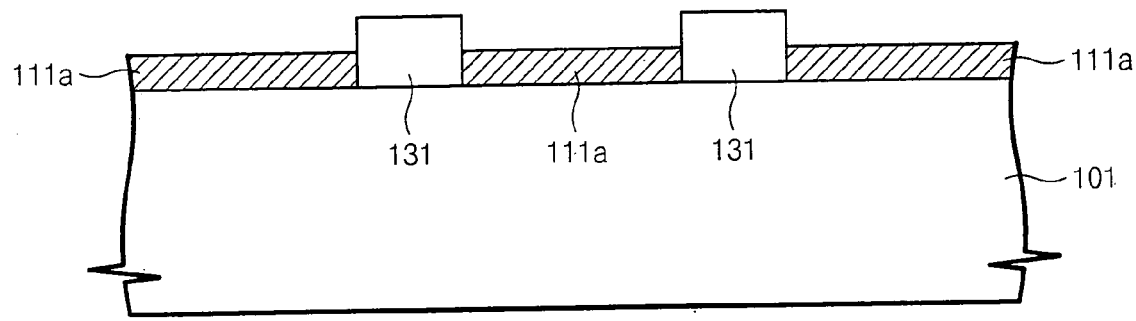
Figure 16B:
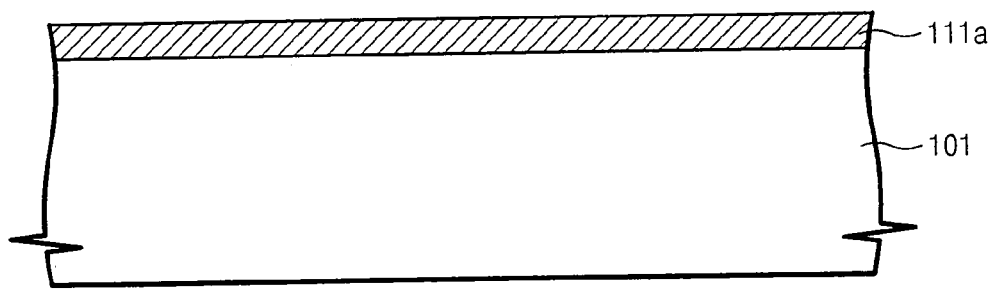
Figure 16C:
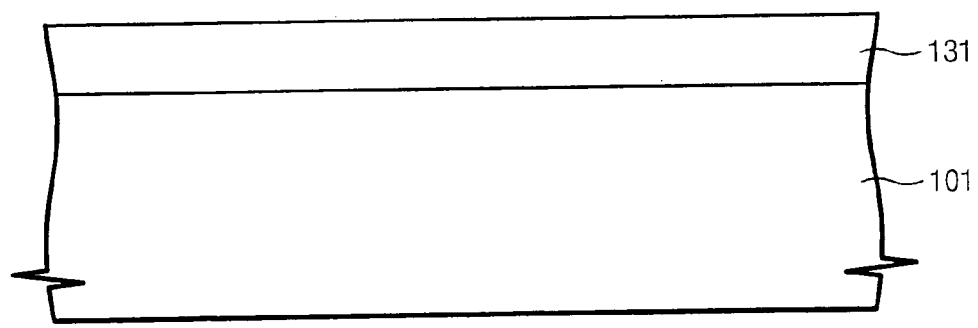

Referring to FIGS. 16A, 16B and 16C, a silicon germanium layer is selectively grown on the exposed substrate 101 using, for example, a selective epitaxial growth technique. As a result, sacrificial layer patterns 111a, which are formed of the epitaxial silicon germanium layer, are located between the dummy gate patterns 131. In addition, a protection layer (not shown) may be selectively formed on each of the sacrificial layer patterns 111a using, for example, an epitaxial technique. The protection layer (not shown) may be formed to protect the sacrificial layer patterns 111a and to increase total thickness of junction regions to be formed in a subsequent process (116 of FIG. 24).

Figure 17A:
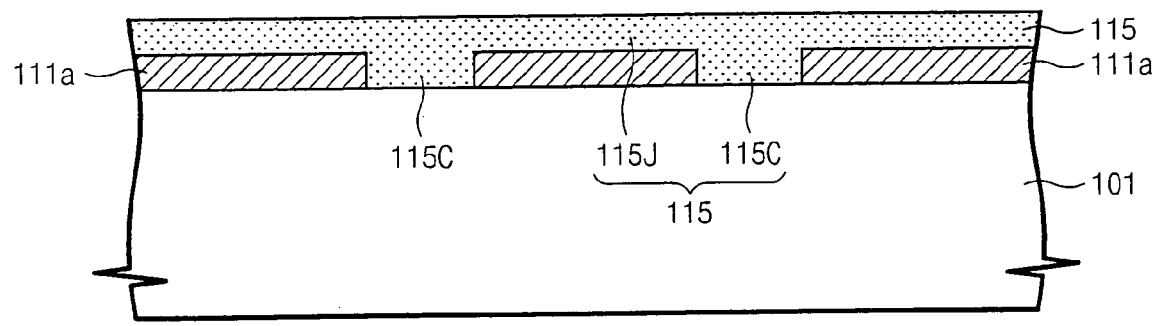
Figure 17B:
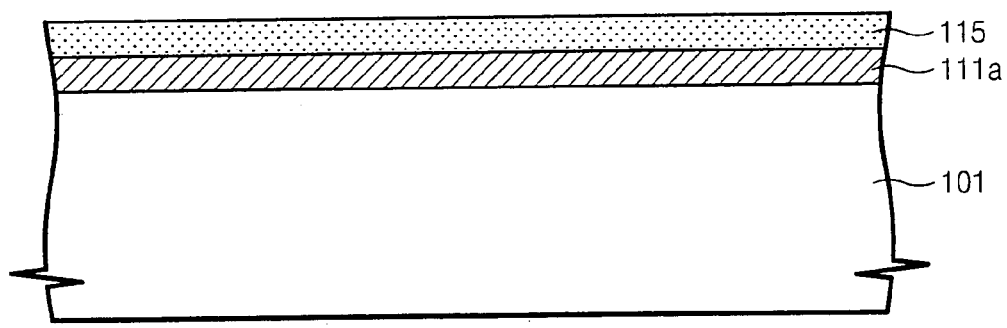
Figure 17C:
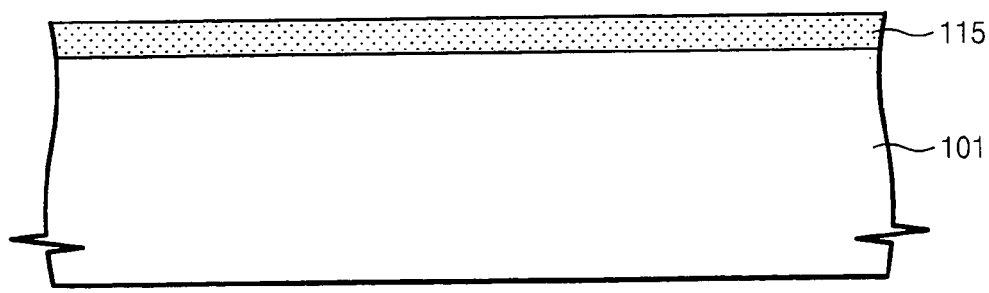

Referring now to FIGS. 17A, 17B and 17C, the dummy gate patterns 131 may be removed. The sacrificial layer patterns 111a may be formed to have the same configuration and array as the sacrificial layer patterns shown in FIGS. 6A to 6C. An epitaxial layer 115, for example, an epitaxial silicon layer, is formed on a surface of the substrate 101. The epitaxial layer 115 is formed to have a flat top surface as shown in FIGS. 17A to 17C. However, in certain embodiments of the present invention, the epitaxial layer 115 may be formed to have a conformal top surface. MOS transistors according to embodiments of the present invention are completed using the processing steps discussed above with respect to FIGS. 8A to 14A, FIGS. 8B to 14B and FIGS. 8C to 14C.

Figure 18A:
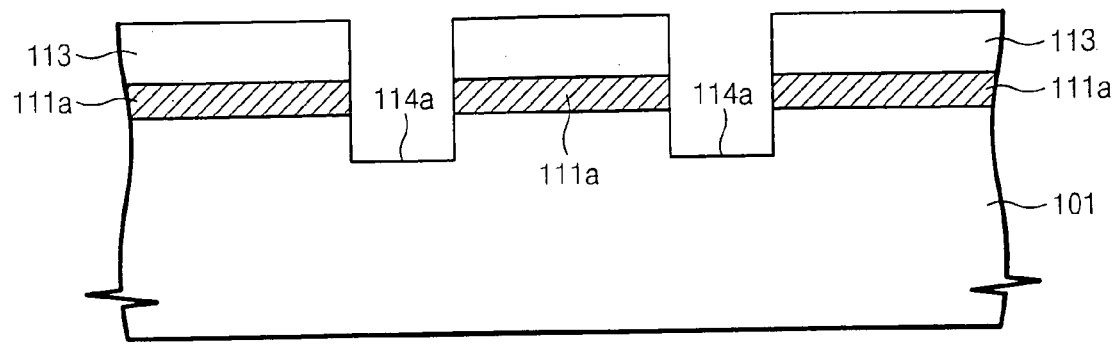
FIGS. 18A and 19A, FIGS. 18B and 19B, and FIGS. 18C and 19C are cross sections taken along the lines 1A–1A', 1B–1B' and 1C–1C' of FIG. 1, respectively, illustrating processing steps in the fabrication of MOS transistors according to embodiments of the present invention illustrated in FIGS. 3A to 3C.
Figure 18B:
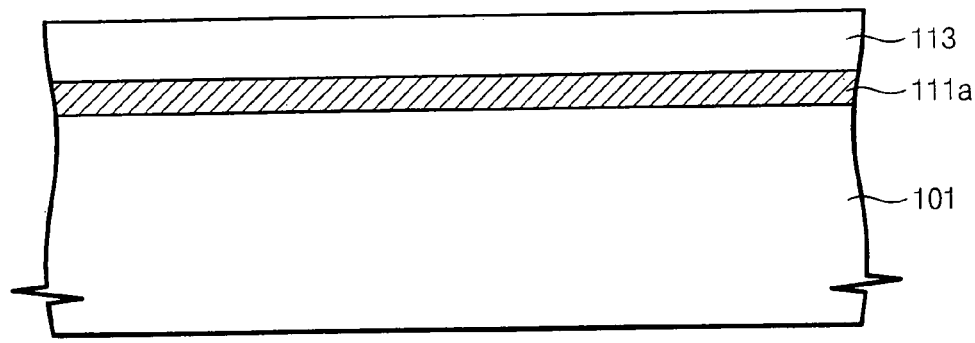
Figure 18C:
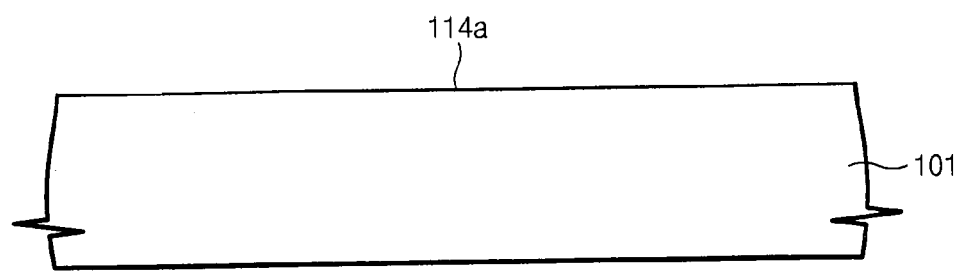

Processing steps in the fabrication of MOS transistors illustrated in FIGS. 3A to 3C will now be discussed with respect to FIGS. 18A, 18B, 18C, 19A, 19B and 19C. FIGS. 18A and 19A, 18B and 19B, and 18C and 18C are cross sections taken along the line 1A–1A', 1B–1B' and 1C–1C', respectively, of FIG. 1. Referring now to FIGS. 18A, 18B and 18C, sacrificial layer patterns 111a and a photoresist pattern 113 are formed as discussed above with respect to FIGS. 5A to 5C and FIGS. 6A to 6C. Accordingly, the substrate 101 between the sacrificial layer patterns 111a is exposed. The exposed substrate 101 is additionally etched to form recessed regions. The recessed regions have a bottom surface 114a lower than a bottom surface of the sacrificial layer patterns 111a.

Figure 19A:
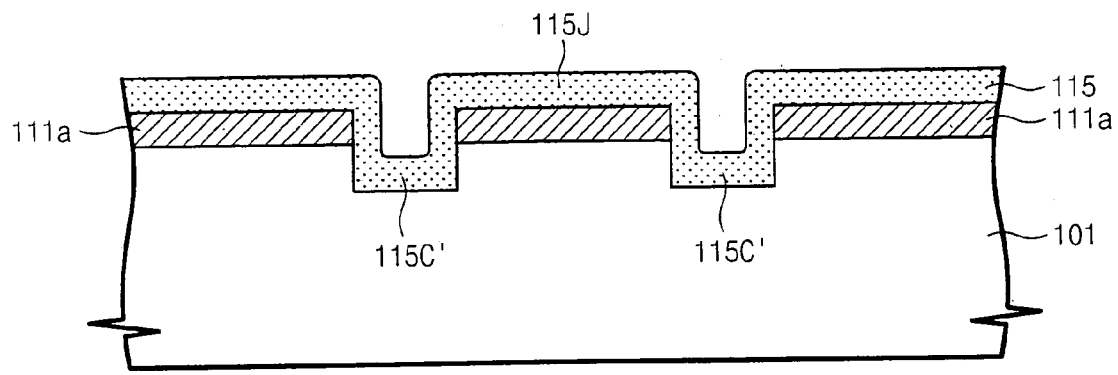
Figure 19B:
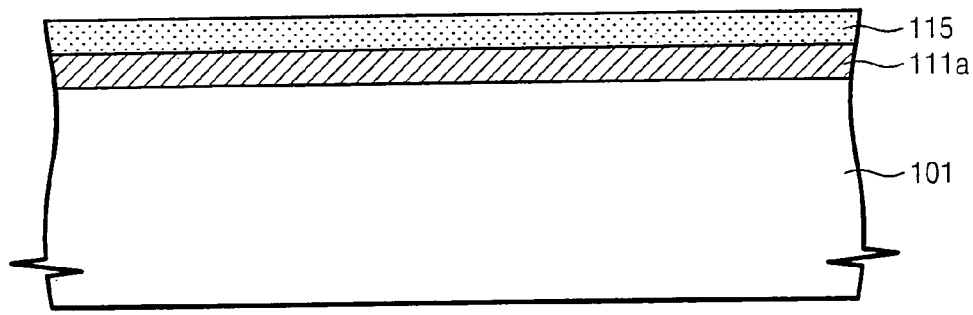
Figure 19C:
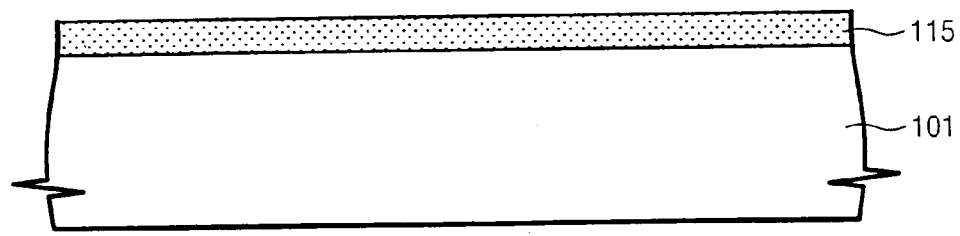

Referring now to FIGS. 19A, 19B and 19C, the photoresist pattern 113 is removed. An epitaxial layer 115 is formed on a surface of the substrate 101. In the event that the epitaxial layer 115 is conformably formed, channel regions 115C' on the bottom surfaces 114a of the recessed regions may be formed to be lower than the channel regions 115C of FIG. 7A. MOS transistors are completed using processing steps discussed above with respect to FIGS. 8A to 14A, FIGS. 8B to 14B and FIGS. 8C to 14C.

According to embodiments of the present invention illustrated in FIGS. 18A, 18B, 18C, 19A, 19B and 19C, the substrate is etched after the formation of the sacrificial layer patterns 111a. Thus, in the event that the epitaxial layer 115 is conformably formed, the bottom surfaces of the gate electrodes may be lower than the bottom surfaces of the junction regions and may be located at the same level as the bottom surfaces of the sacrificial layer patterns 111a (FIG. 4A).

Alternatively, the epitaxial layer 115 may be formed to have a flat top surface as shown in FIG. 17A. The flat epitaxial layer 115 may be formed by, for example, growing the epitaxial layer to have a thickness greater than half of a distance between the adjacent sacrificial layer patterns 111a. Alternatively, the formation of the flat epitaxial layer 115 may include, for example, forming a conformal epitaxial layer and annealing the conformal epitaxial layer. The annealing process may be performed using, for example, a hydrogen gas or an argon gas as an ambient gas. Alternatively, the annealing process may be performed using a laser.

Figure 20:
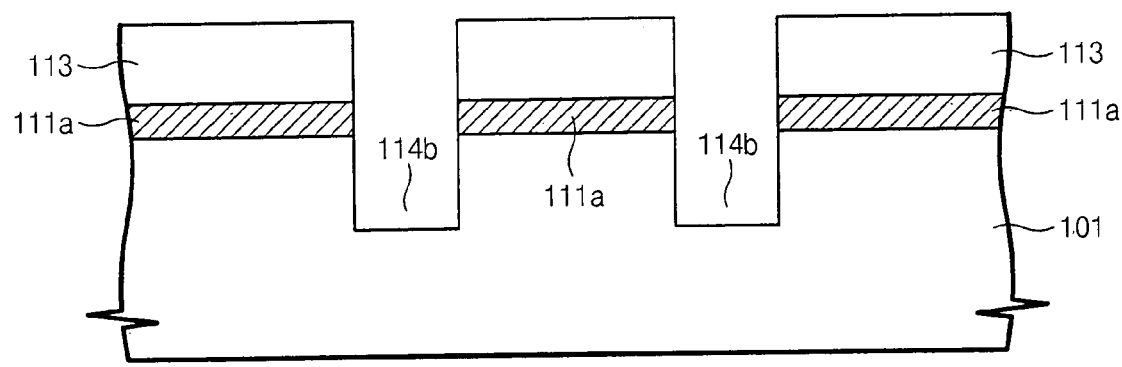
FIGS. 20 and 21 are cross sections taken along the line 1A–1A' of FIG. 1 illustrating processing steps in the fabrication of MOS transistors according to embodiments of the present invention illustrated in FIGS. 4A to 4C.
Figure 21:
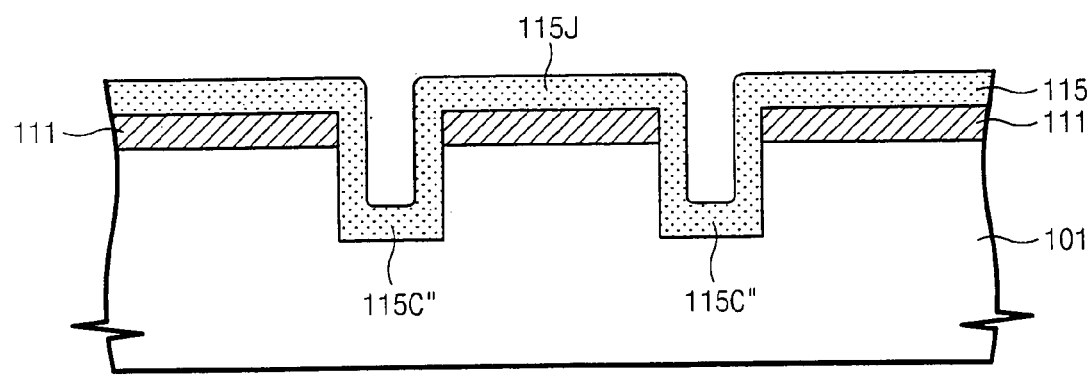

Processing steps in the fabrication of MOS transistors illustrated in FIGS. 4A to 4C are discussed with reference to FIGS. 20 and 21. FIGS. 20 and 21 are cross sections taken along the line 1A–1A' of FIG. 1. Referring now to FIG. 20, sacrificial layer patterns 111a and a photoresist pattern 113 are formed as discussed above with reference to FIGS. 5A to 5C and FIGS. 6A to 6C. The substrate 101 between the sacrificial layer patterns 111a is exposed. The exposed substrate 101 is etched to form recessed regions having bottom surfaces 114b, which may be lower than the bottom surfaces 114a of FIG. 18a.

Figure 23:
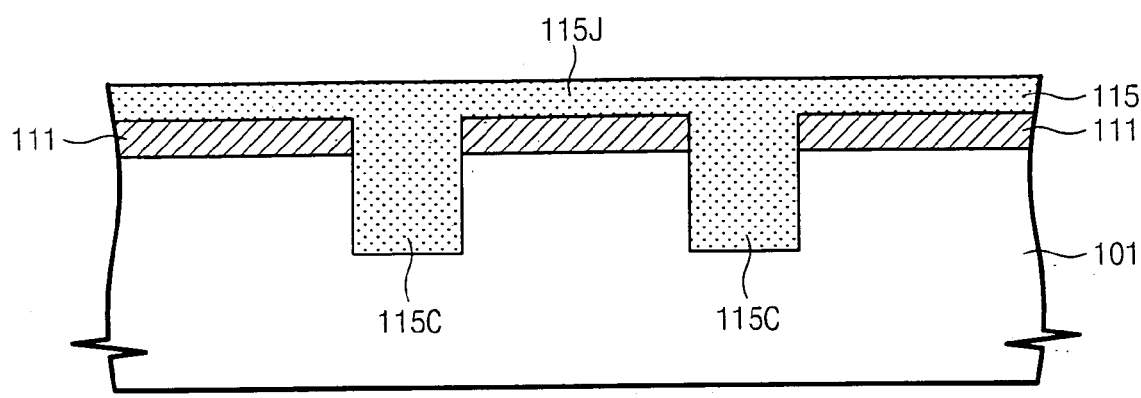
FIG. 23 is a cross section illustrating MOS transistors having planarized epitaxial layers formed on sacrificial layer patterns according to some embodiments of the present invention.
Figure 24:
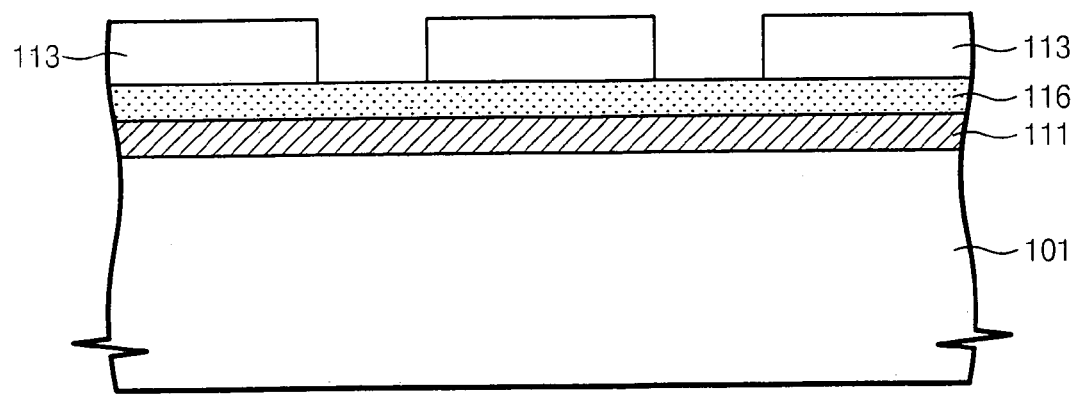
FIG. 24 is a cross section illustrating MOS transistors having a protection layer on the sacrificial layer according to some embodiments of the present invention.

Referring to FIG. 21, the photoresist pattern 113 is removed. An epitaxial layer 115 is formed on a surface of the substrate 101. In the event that the epitaxial layer 115 is conformably formed, channel regions 115C'' on the bottom surfaces 114b of the recessed regions may be formed to be lower than the channel regions 115C' of FIG. 19A. MOS transistors according to embodiments of the present invention are completed as discussed above with respect to FIGS. 8A to 14A, FIGS. 8B to 14B and FIGS. 8C to 14C. In certain embodiments of the present invention, the epitaxial layer 115 may also be formed to have a flat top surface as illustrated in FIG. 23.

Figure 22A:
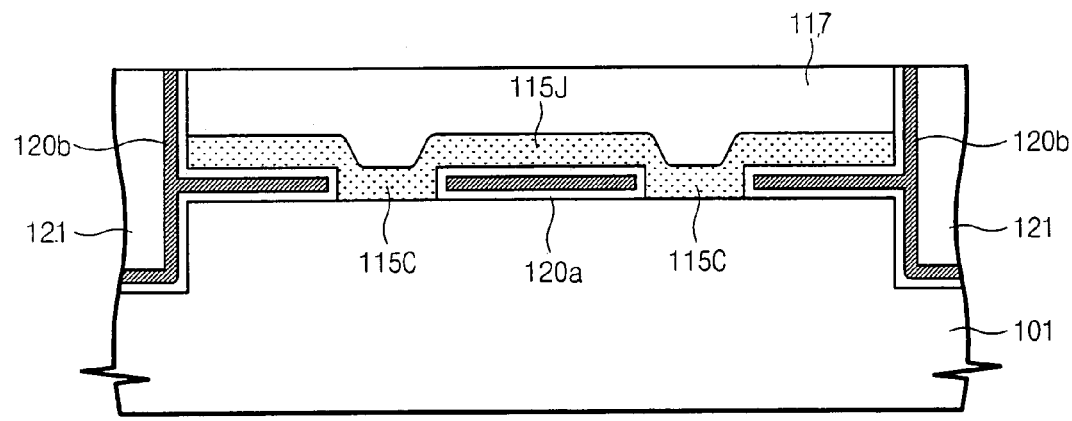
FIGS. 22A to 22C are cross sections taken along the lines 1A–1A', 1B–1B' and 1C–1C' of FIG. 1, respectively, illustrating processing steps in the fabrication of MOS transistors illustrated in FIGS. 2A to 2C.
Figure 22B:
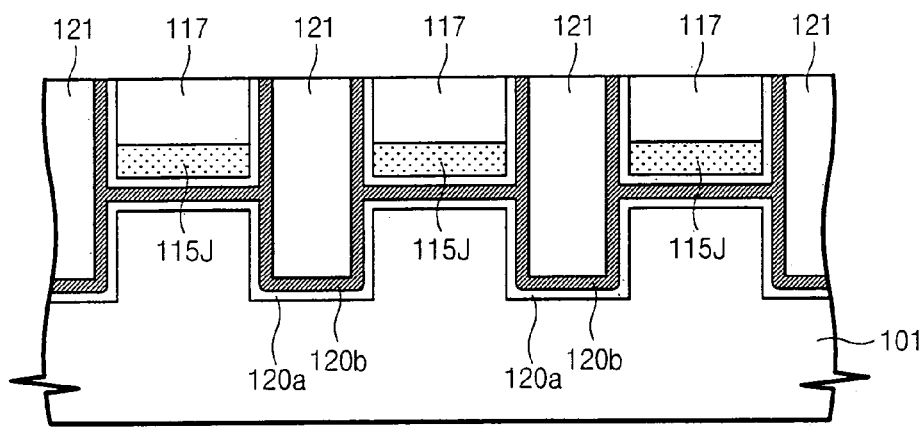
Figure 22C:
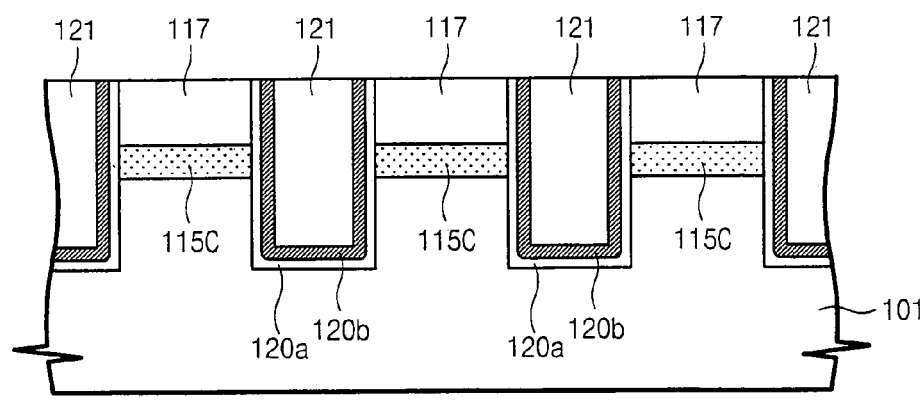

As discussed above, the buffer regions 111V may be filled with an oxide layer. Further, nitride liners may be additionally formed in the oxide layer that fill the buffer regions 111V. FIGS. 22A, 22B and 22C are cross section illustrating processing steps in the fabrication of MOS transistors according to embodiments of the present invention. FIGS. 22A, 22B and 22C are cross sections taken along the line 1A–1A', 1B–1B', and 1C–1C', respectively, of FIG. 1.

Referring now to FIGS. 22A to 22C, a trench 119 is formed as discussed above with respect to FIGS. 10A to 10C. A thermal treatment is performed to cure the etch damage applied to the substrate 101 during formation of the trench 119. Accordingly, a thermal oxide layer 120a is formed on the inner walls of the trench 119 and the buffer regions 111V. A nitride liner 120b is formed on the thermal oxide layer 120a. The nitride liner 120b may be formed in the buffer regions 111V surrounded by the thermal oxide layer 120a. An isolation layer 121 is formed in the trench 119 using methods discussed. The MOS transistor is completed using processing steps discussed above.

Processing steps in the fabrication of MOS transistors illustrated in FIGS. 2A, 3A and 4A according to further embodiments of the present invention will now be discussed. Embodiments of the present invention illustrated in FIGS. 2A, 3A and 4A. In FIGS. 25 to 34, the region "A"0 represents a conventional transistor region and the region "B" represents MOS transistors according to embodiments of the present invention.

Figure 25:
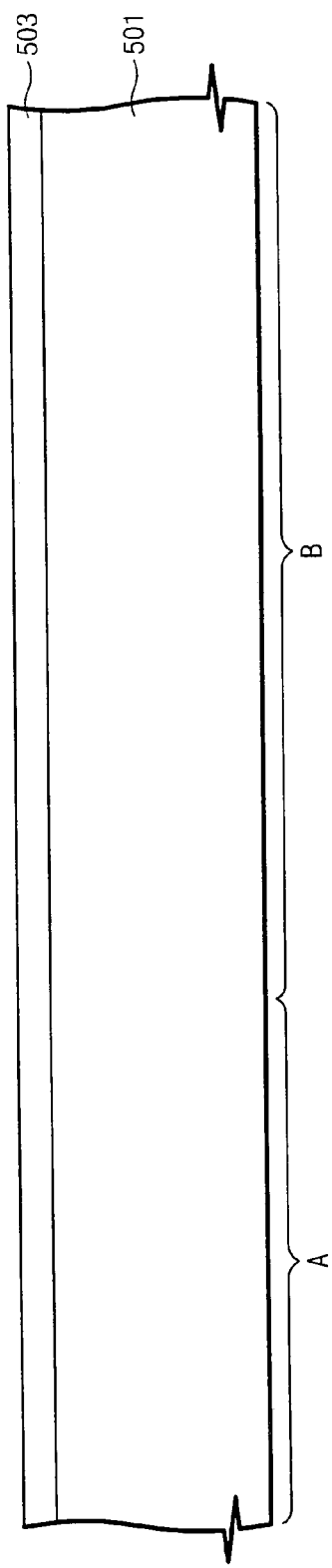
Figure 26:
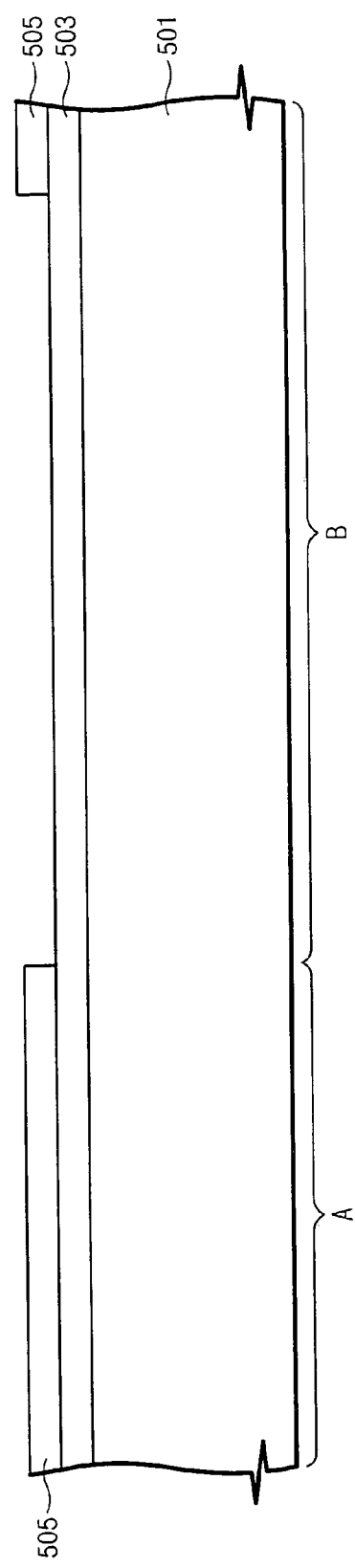
Figure 27:
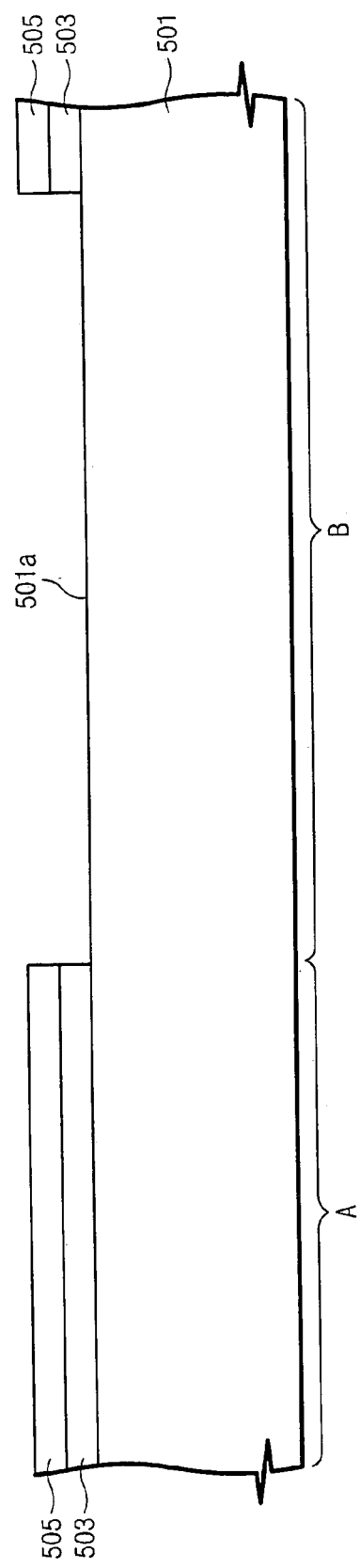

Referring now to FIGS. 25, 26 and 27, a pad oxide layer 503 is formed on a surface of an integrated circuit substrate 501. It will be understood that in certain embodiments of the present invention a pad nitride layer may be formed instead of the pad oxide layer 503. A photoresist pattern 505 is formed on the pad oxide layer 503. The photoresist pattern 505 is formed to selectively expose the pad oxide layer 503 in the region "B". The exposed pad oxide layer 503 is etched using the photoresist pattern 505 as an etching mask, thereby selectively exposing the substrate 501 in the region "B".

Figure 28:
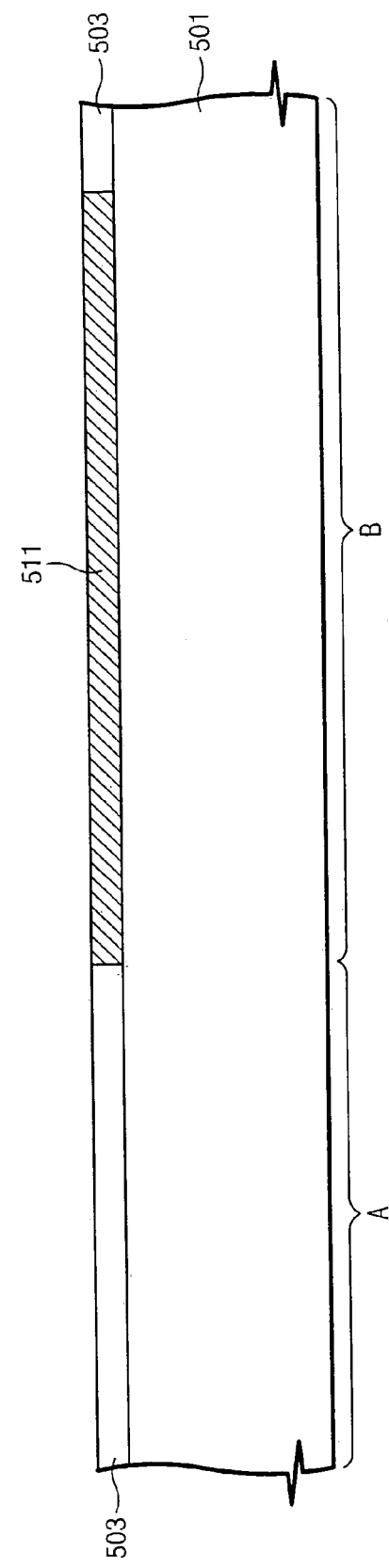

Referring now to FIG. 28, the photoresist pattern 505 is removed. A sacrificial layer 511, for example, a silicon germanium layer, is selectively formed on the exposed substrate 501 using an epitaxial growth technique. The epitaxial silicon germanium layer 511 is not formed in the region "A", since an insulation layer such as, for example, the pad oxide layer 503, is provided on the substrate 501 in the region "A".

Referring now to FIG. 29, the pad oxide layer 503 in the region "A" is removed. A photoresist pattern 513 is formed on the integrated circuit substrate 501 and the sacrificial layer 511. The photoresist pattern 513 is formed to expose regions of the sacrificial layer 511 as shown in FIG. 5A.

Referring now to FIG. 30, the exposed sacrificial layer 511 is etched using, for example, the photoresist pattern 513 as an etching mask. As a result, sacrificial layer patterns 511a are formed in the region "B" as shown in FIG. 6A. The photoresist pattern 513 is then removed. Subsequently, an epitaxial silicon layer 515 is formed on a surface of the substrate having the sacrificial layer patterns 511a. In this case, the epitaxial silicon layer 515 may also be formed on the substrate in the region "A".

Referring now to FIGS. 31 and 32, trench etch mask patterns 517 corresponding to the mask pattern 117 of FIG. 9A are formed on the epitaxial layer 515. The epitaxial layer 515, the sacrificial layer patterns 511a and the substrate 501 are etched using the trench etch mask patterns 517 as etching masks, thereby forming a trench 519 that defines active regions in the regions "A" and "B". The trench 519 exposes the etched sacrificial layer patterns 511a. The sacrificial layer patterns 511a are removed to form buffer regions 511V in the region "B".

Figure 33:
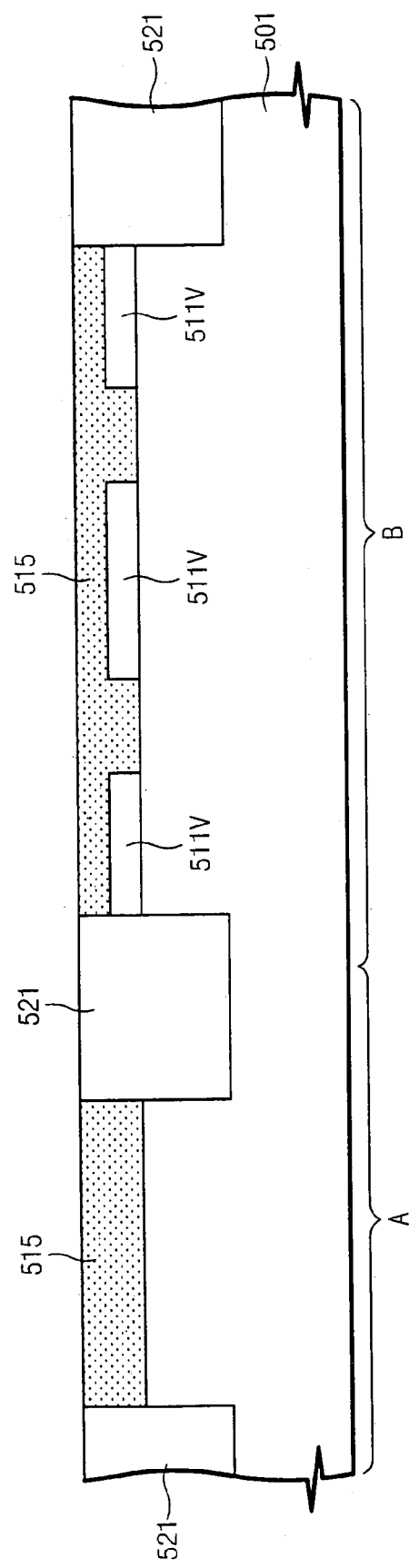
Figure 34:
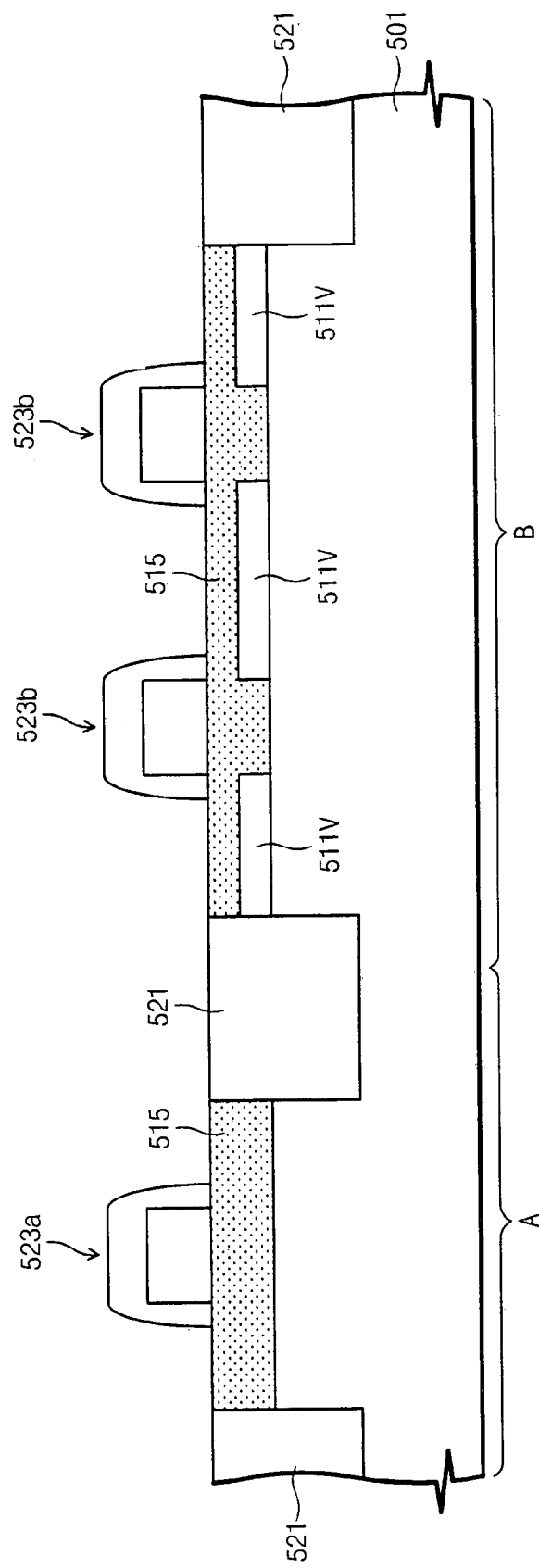

Referring now to FIGS. 33 and 34, an isolation layer 521 is formed in the trench 519. Gate stacks 523a and 523b are formed in the regions "A" and "B" respectively. The transistors are completed using processes described above. A protection layer (not shown) may be formed on the sacrificial layer 511 prior to formation of the photoresist pattern 513. The sacrificial layer 511 of FIG. 28 may be selectively formed in the region "B" using a different manner from the modified embodiment described above. That is, an epitaxial silicon germanium layer is formed on an entire surface of the integrated circuit substrate. The epitaxial silicon germanium layer in the region "A" is selectively removed using, for example, a photolithography/etching process, thereby leaving a sacrificial layer in the region "B".

Figure 35:
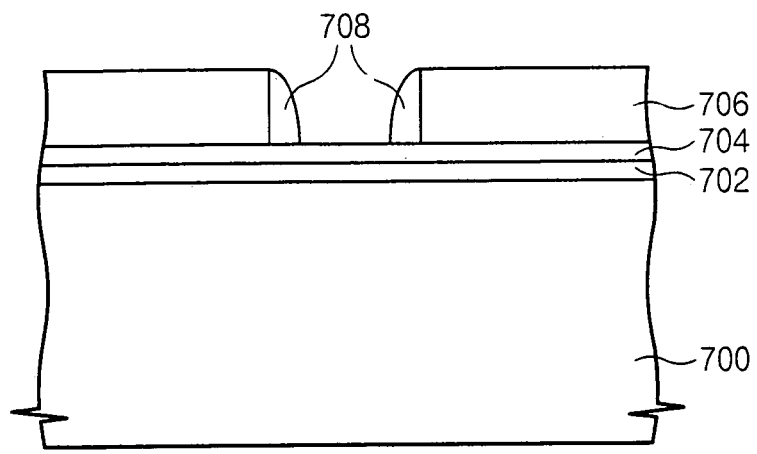
FIGS. 35 to 43 are cross sections illustrating processing steps in the fabrication of MOS transistors according to some embodiments of the present invention.
Figure 36:
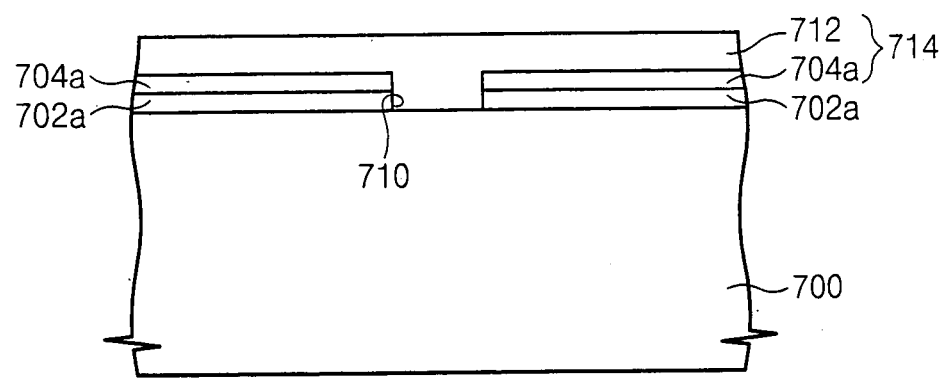

Referring now to FIGS. 35 to 43, cross sections illustrating processing steps in the fabrication of MOS transistors according to some embodiments of the present invention will be discussed. As illustrated in FIGS. 35 and 36, an epitaxial sacrificial layer 702 is formed on an integrated circuit substrate 700 using a first epitaxial growth technique. The epitaxial sacrificial layer 702 may be formed of semiconductor materials having an etch selectivity with respect to the integrated circuit substrate 700. The integrated circuit substrate 700 may include, for example, silicon and the epitaxial sacrificial layer 702 may include, for example, silicon germanium. The silicon germanium layer may have an etch selectivity with respect to the silicon substrate.

A supplemental epitaxial layer 704 is formed on the epitaxial layer 702 using a second epitaxial growth technique. The supplemental epitaxial layer 704 may have an etch selectivity with respect to the epitaxial sacrificial layer 702. For example, the supplemental epitaxial layer 704 may be the same material as the integrated circuit substrate 700, for example, silicon.

A hard mask layer 706 is formed on the supplemental epitaxial layer 704 and patterned to form an opening that exposes a region of the supplemental epitaxial layer 704. The hard mask layer 706 may be formed of materials having an etch selectivity with respect to the supplemental epitaxial layer 704, the epitaxial sacrificial layer 702 and the substrate 700. The hard mask layer 706 may include, for example, silicon nitride.

Mask spacers 708 are formed on sidewalls of the opening. The mask spacers 708 may be formed of materials having an etch selectivity with respect to the supplemental epitaxial layer 704, the epitaxial sacrificial layer 702 and the substrate 700. The mask spacers 708 may be formed, for example, of silicon nitride.

The supplemental epitaxial layer 704 and the epitaxial sacrificial layer 702 are successively etched using the hard mask layer 706 and the mask spacers 708 as an etch mask to expose a region of the substrate 700. As a result, an intaglio pattern 710 is formed. Accordingly, first and second spaced apart epitaxial sacrificial patterns 702a are formed. Similarly, first and second supplemental epitaxial patterns 704a are formed on the epitaxial sacrificial patterns 702a. During the formation of the intaglio pattern 710, the time involved in forming the recess that exposed the substrate 700 may be reduced because the epitaxial sacrificial layer 702 may have an etch selectivity with respect to the integrated circuit substrate 700.

If a width of the opening of the hard mask layer 706 is a minimum line width defined within a limitation of a photolithography technique, the intaglio pattern 710 may have a width that is smaller than the minimum line width beyond the limitation of a photolithography technique because of the mask spacers 708. Alternatively, in some embodiments of the present invention, the step of forming the mask spacers 708 may not be performed.

The hard mask layer 706 and the mask spacer 708 are removed to expose the first and second supplemental epitaxial patterns 704a. A main epitaxial layer 712 is formed on the exposed integrated circuit substrate and on the first and second supplemental epitaxial patterns 704a using a third epitaxial growth technique. The main epitaxial layer 712 may be formed to fill the intaglio pattern 710. The main epitaxial layer 712 may be formed of materials having an etch selectivity with respect to the epitaxial sacrificial pattern 702a. In addition, the main epitaxial layer 712 may be formed of the same material as that of the first and second supplemental epitaxial patterns 704a. The main epitaxial layer 712 may be, for example, a silicon layer. The first and second supplemental epitaxial patterns 704a and the main epitaxial layer 712 compose an epitaxial layer 714. Alternatively, in certain embodiments of the present invention, the epitaxial layer 714 may consist of the main epitaxial layer 712 without the supplemental epitaxial layer 704.

Well impurity ions may be selectively implanted into the integrated circuit substrate 700 with the epitaxial layer 714 to form a well (not shown). The well may be doped with first conductivity type impurities. In some embodiments of the present invention, the integrated circuit devices may be NMOS field effect transistors (FETs) and the well may be doped with p-type impurities. In further embodiments of the present invention, the devices may be PMOS FETs and the well may be doped with n-type impurities.

Figure 37:
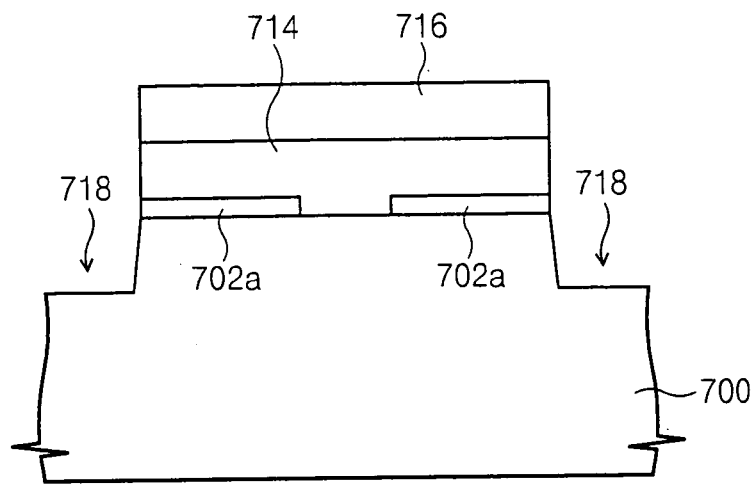
Figure 38:
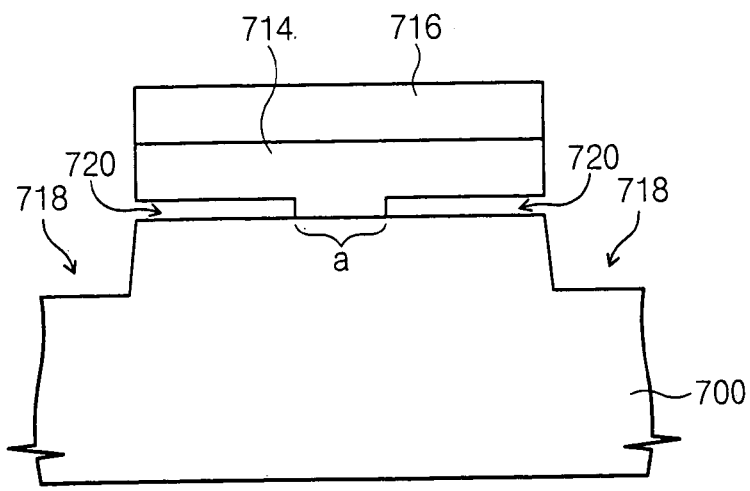

Referring now to FIGS. 37 and 38, an etch mask pattern 716 is formed on the main epitaxial layer 714 to define an active region. The etch mask pattern 716 may be formed of materials having an etch selectivity with respect to the epitaxial layer 714, the first and second epitaxial sacrificial patterns 702a and the integrated circuit substrate 700. The etch mask pattern 716 may be a silicon nitride layer.

The epitaxial layer 714, the first and second epitaxial sacrificial patterns 702a and the integrated circuit substrate 700 are successively etched using the etch mask pattern 716 as a mask to form a trench 718 that defines an active region. In some embodiments of the present invention, the first and second epitaxial sacrificial patterns 702a may be exposed on sidewalls of the trench 718.

The exposed epitaxial sacrificial patterns 702a are removed to form first and second buffer regions 720. A portion of epitaxial layer 714 positioned between the buffer regions 720 may connect the epitaxial layer 714 to the substrate 700, i.e. may be a connecting part "a". The epitaxial layer 714 is supported by the connecting part "a" on the substrate 700. The exposed first and second epitaxial sacrificial pattern 702a may be removed using a wet etch process.

Figure 39:
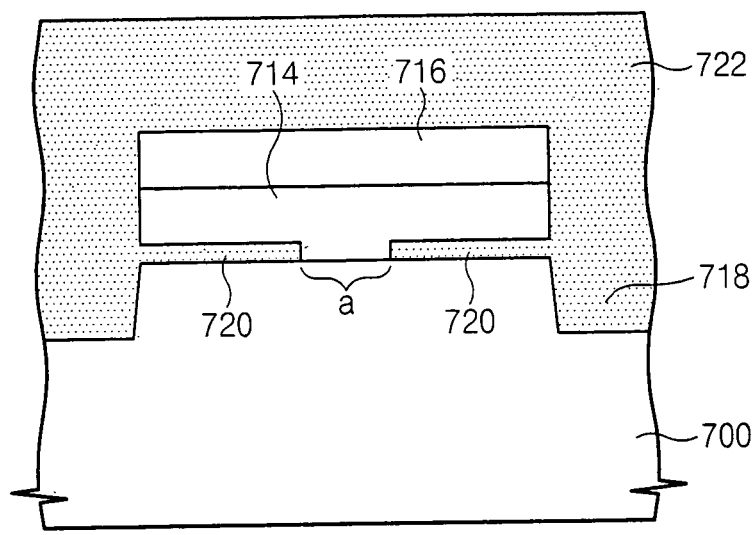
Figure 40:
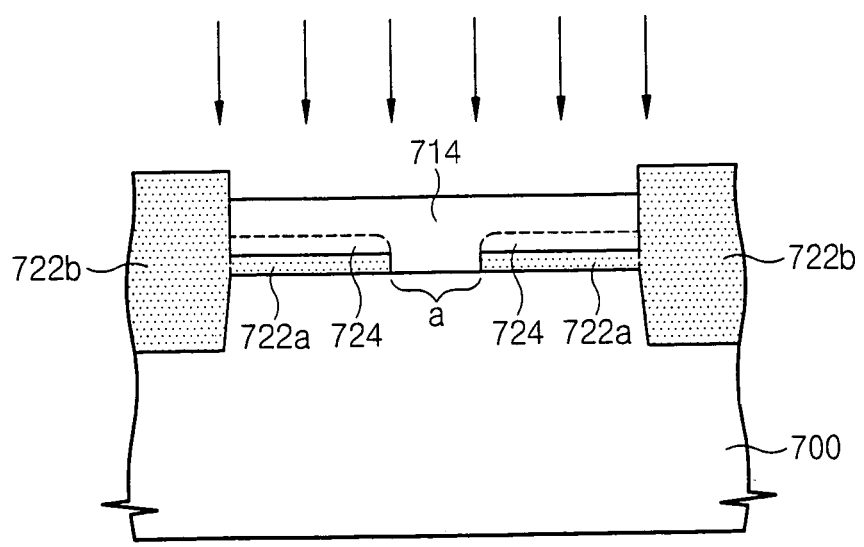

Referring now to FIGS. 39 and 40, a thermal oxide layer may be formed on inner sidewalls of the buffer regions 720 and the trench 718 using a thermal oxidation technique, for example, as described above with respect to certain embodiments of the present invention. Furthermore, a liner layer may be formed on a surface of the integrated circuit substrate 700 after the thermal oxidation process. An insulation layer 722 may be formed in the trench 718. Accordingly, buried insulation layers 722a may be formed in the buffer regions 720, filling at least a portion of the buffer regions 720. The buried insulation layers 722a may fill only a portion of the buffer regions 720 or fill the entire buffer regions 720 without departing from the scope of the present invention. In embodiments of the present invention illustrated in FIG. 40, the buried insulation layers 722a fill the buffer regions 720. The buried insulation layers 722a may include a thermal oxide layer, a portion of the liner and/or a portion of the isolation layer 722. The insulation layer 722 may be, for example, a silicon oxide layer formed using a chemical vapor deposition technique or a spin coating technique. For example, the insulation layer 722 may include a high-density plasma oxide, undoped silicate glass (USG), or materials including spin on glass (SOG).

The insulation layer 722 is planarized until a top surface of the etch mask pattern 716 is exposed, to form an isolation layer 722b in the trench 718. The exposed etch mask pattern 716 is removed to expose a top surface of the epitaxial layer 714.

Channel doped impurity ions are implanted into the exposed epitaxial layer 714. The channel-doping impurities control a threshold voltage of a FET. The channel- doping impurities may have a conductivity type similar to that of the well impurities. In other words, in some embodiments of the present invention, the FET may be a NMOS-FET and the channel-doping impurities may be n-type impurities. However, in further embodiments of the present invention, the FET may be a PMOS-FET and the channel-doping impurities may be p-type impurities.

A thermal treatment is applied to the integrated circuit substrate 700. The thermal treatment may be performed at a temperature of, for example, from about 700° C. to about 1200° C. The implanted channel-doping impurities are activated and an accumulated diffusion layer 724 is formed on the buried insulation layer 722a by means of, for example, the thermal treatment. The accumulated diffusion layer 724 has an impurity concentration higher than the connecting part "a" of the epitaxial layer 714. In other words, the buried insulation layer 722a may prevent a portion of the channel-doping impurities from diffusing into the integrated circuit substrate 700 during the thermal treatment. Thus, a portion of the channel-doping impurities are accumulated on the buried insulation layer 722a to form the accumulated diffusion layer 724 and the channel-doping impurities implanted into the connection part "a" of the epitaxial layer 714 diffuse into the substrate 700 by means of the thermal treatment. Accordingly, the accumulated diffusion layer 724 has an impurity concentration higher than that of the connection part "a" of the epitaxial layer 714.

Figure 41:
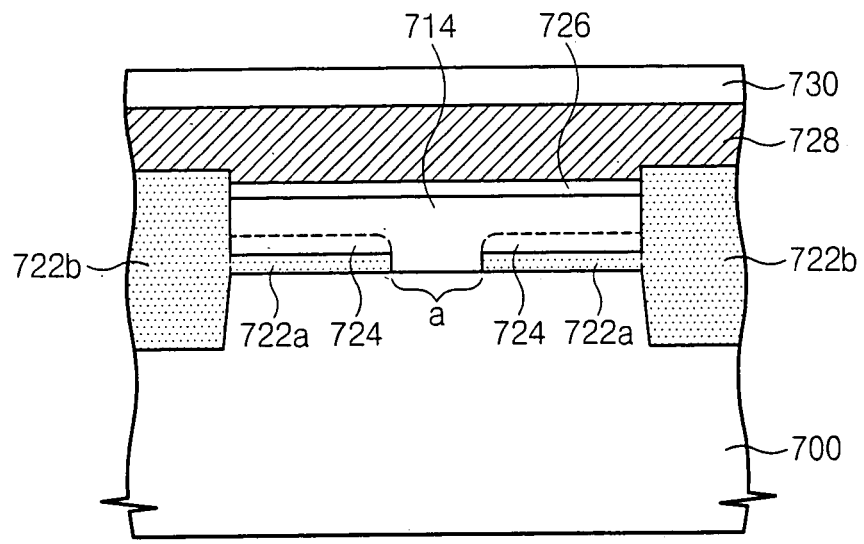
Figure 42:
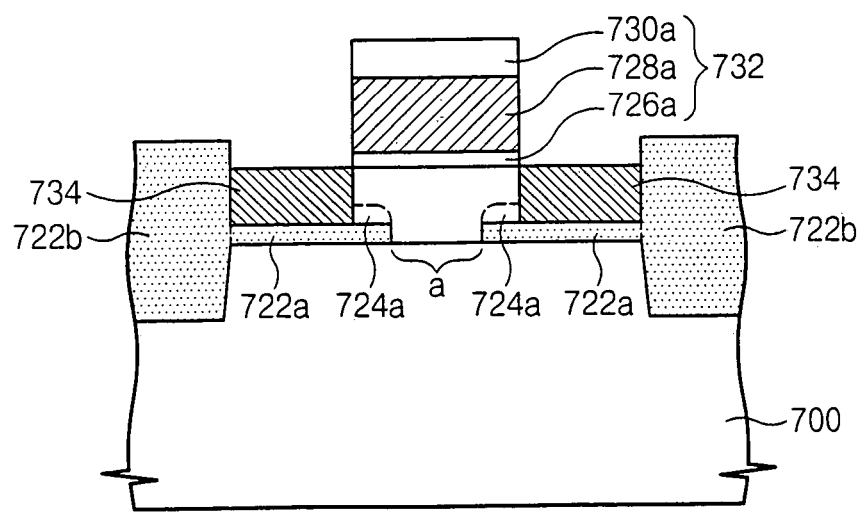
Figure 43:
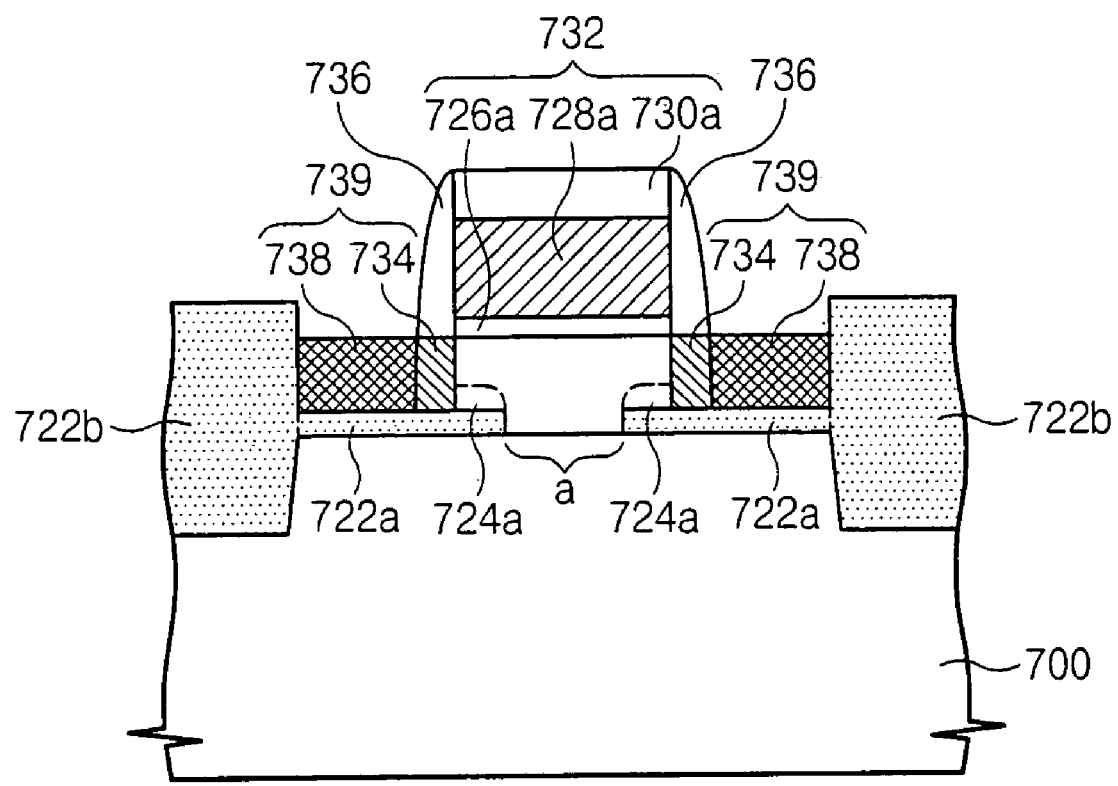

Referring now to FIGS. 41, 42, and 43, a gate insulation layer 726 is formed on the integrated circuit substrate 700 with the accumulated diffusion layer 724. The gate insulation layer 726 may include, for example, silicon oxide, for example, a thermal oxide layer. A gate conductive layer 728 and a capping layer 730 are sequentially formed on a surface of the integrated circuit substrate 700 with the gate insulation layer 726. The gate conductive layer 728 may be, for example, a doped polysilicon layer, a polycide layer, or a conductive metallic layer. The conductive metallic layer may include, for example, a metal such as tungsten or molybdenum, a conductive metal nitride such as titanium nitride, tantalum nitride or tungsten nitride, and/or a metal silicide such as tungsten silicide. The capping layer 730 may include, for example, silicon nitride.

The capping layer 730, the gate conductive layer 728 and the gate insulation layer 726 are successively patterned to form a gate pattern 732 on the active region. The gate pattern 732 is disposed over the connecting part "a" of the epitaxial layer. The gate pattern 732 may be formed such that a portion of the gate pattern 732 overlaps the buffer region 720. The gate pattern 732 may be formed to have a minimum line width defined within a limitation of a photolithography technique. If the line width of the gate pattern 732 is formed to be the minimum line width defined within a limitation of the photolithography technique, the gate pattern 732 may overlap the buffer region 720 as illustrated in FIG. 42.

The gate pattern 732 includes a gate insulation pattern 726a, a gate electrode 728a and a capping pattern 730a that are sequentially stacked. As illustrated in FIG. 42, the gate insulation pattern 726a is positioned between the gate electrode 728a and the epitaxial layer 714. However, a portion of the gate insulation pattern 726a may remain on the active region at both sides of the gate electrode 728a.

Using the gate pattern 732 as an etch mask, first source/drain impurity ions are implanted into the active region on both sides of the gate pattern 732 to form low-concentration junction regions 734. The first source/drain impurity ions may be a different type of impurity from the channel-doping impurities. In other words, the channel-doping impurities may have a first conductivity type and the first source/drain impurities may have a second conductivity type. For example, if the channel-doping impurities are p-type impurities, the first source/drain impurities may be n-type impurities and visa versa.

A bottom surface of the low-concentration junction region 734 may contact the buried insulation layer 722a. In some embodiments of the present invention, the accumulated diffusion layer 724 may remain on a portion of the buried insulation layer 722a overlapping the gate pattern 732. The residual accumulated diffusion layer 724 may be equivalent to a halo region 724a.

Spacers 736 are formed on both sidewalls of the gate pattern 732. Second source/drain impurity ions are implanted using the gate pattern 732 and the spacers 736 as a mask to from high-concentration junction regions 738. The second source/drain impurities may have the same conductivity type as that of the first source/drain impurities. The second source/drain impurity ions may be implanted at a high dose relative to the first source/drain impurity ions. The low-concentration and high-concentration junction regions 734 and 738 may comprise source/drain regions 739. In some embodiments of the present invention, the source/drain regions 739 may include the low-concentration junction region 734 without the high-concentration junction region 738 without departing from the scope of the present invention.

In still further embodiments of the present invention, the halo region 724a may contact one side of the source/drain regions 739. The halo region 724a is positioned between the source drain regions 739. The halo region 724a has an impurity concentration higher than that of the connection part "a" of the epitaxial layer 714. Accordingly, a depletion region formed adjacent to the junction region between the source/drain regions 739 and the halo region 724a may be reduced relative with that of the prior art. Furthermore, the depletion region formed in the halo region 724a on the basis of the junction may be decreased. Accordingly, a punchthrough characteristic may be improved.

Forming the halo region may not require any additional steps of implanting impurity ions. Thus, lattice defects of the epitaxial layer 714 due to the additional implantation steps may be reduced. The impurity concentration of the source/drain regions 739 may also be more consistent due to the lack of additional implantation steps. As a result, the overall characteristics of the FET may be improved.

According to embodiments of the present invention discussed with respect to FIGS. 34 through 43, channel-doping impurity ions are implanted into an epitaxial layer to control a threshold voltage, and a thermal treatment is performed to form an accumulated diffusion layer on the epitaxial layer placed on a buffer regions. A gate electrode is formed on the epitaxial layer and one side thereof may overlap one side of the buffer region. Thus, a halo region is formed on the buffer regions overlapping the gate electrode. The presence of the halo region may provide improved punchthrough characteristics between junction regions at both sides of the gate electrode. As a result, a highly integrated circuit device may be provided. Furthermore, the halo region may be formed according to embodiments of the present invention without additional ion implantation steps, such that lattice defects of the epitaxial layer and variation of impurity concentration of source/drain regions may be reduced.

As briefly described above with respect to FIGS. 1 through 43, buffer regions are between source/drain regions and an integrated circuit substrate. The presence of these regions may possibly reduce the junction capacitance and the junction leakage current of the source/drain regions without using a SOI substrate. Furthermore, the channel regions may be formed to be lower than bottom surfaces of the source/drain regions. Accordingly, embodiments of the present invention may suppress the short channel effect of the MOS transistor.

In the drawings and specification, there have been disclosed typical preferred embodiments of the invention and, although specific terms are employed, they are used in a generic and descriptive sense only and not for purposes of limitation, the scope of the invention being set forth in the following claims.

What is claimed is:

1. A method of forming a unit cell of a metal oxide semiconductor (MOS) transistor, comprising:
    forming an integrated circuit substrate;
    forming a MOS transistor on the integrated circuit substrate, the MOS transistor having a source region, a drain region and a gate, the gate being between the source region and the drain region;
    forming first and second spaced apart buffer regions beneath the source region and the drain region and between respective ones of the source region and integrated circuit substrate and the drain region and the integrated circuit substrate; and
    forming a channel region beneath the gate and between the source and drain regions, wherein the first and second buffer regions are defined by the channel region and respective ones of the source and drain regions and wherein a portion of an upper surface of the channel region is lower than upper surfaces of the first and second buffer regions,
    wherein forming the gate comprises forming a gate electrode on the channel region and forming a capping layer on the gate electrode, wherein a bottom surface of the gate electrode is lower than bottom surfaces of the first and second buffer regions and wherein a bottom surface of the channel region is lower than the bottom surfaces of the first and second buffer regions.

2. A method of fabricating a MOS transistor, the method comprising:
    forming epitaxial sacrificial layer patterns on an integrated circuit substrate, the sacrificial layer patterns being formed to separate from each other;
    forming an epitaxial layer on a surface of the substrate having the sacrificial layer patterns, the epitaxial layer producing junction regions and channel regions;
    patterning the epitaxial layer, the sacrificial layer patterns and the integrated circuit substrate to form a trench that defines active regions;
    removing the sacrificial layer patterns to produce buffer regions;
    forming an isolation layer in the trench;
    forming a gate electrode on the epitaxial layer between the adjacent buffer regions; and
    implanting impurity ions into the epitaxial layer using the gate electrode as an implantation mask, thereby forming source/drain junction regions at both sides of the gate electrode.

3. The method of claim 2 further comprising performing a thermal process prior to formation of the isolation layer.

4. The method of claim 3, wherein the thermal process produces a thermal oxide layer formed at inner walls of the buffer regions and the trench.

5. The method of claim 4 further comprising forming a nitride liner on the thermal oxide layer prior to formation of the isolation layer.

6. The method of claim 2, wherein forming the sacrificial layer patterns comprises:
    forming an epitaxial sacrificial layer on a surface of the integrated circuit substrate;
    forming a photoresist pattern on the sacrificial layer;
    etching the sacrificial layer using the photoresist pattern as an etching mask; and
    removing the photoresist pattern.

7. The method of claim 6, wherein the integrated circuit substrate is etched after formation of the sacrificial layer patterns.

8. The method of claim 6 further comprising forming a protection layer on the sacrificial layer prior to formation of the photoresist pattern.

9. The method of claim 2, wherein forming the sacrificial layer patterns comprises:
    forming dummy gate patterns, spaced apart from each other, on an integrated circuit substrate;
    selectively forming sacrificial layer patterns on the integrated circuit substrate between the dummy gate patterns; and
    removing the dummy gate patterns.

10. The method of claim 9, wherein the dummy gate patterns comprise an oxide layer or a nitride layer.

11. The method of claim 9 further comprising selectively forming a protection layer on the sacrificial layer patterns prior to removal of the dummy gate patterns.

12. The method of claim 2 further comprising forming a silicide layer on the source/drain junction regions.

13. The method of claim 2, wherein forming the trench comprises:
    forming an etch mask pattern on the epitaxial layer; and
    etching the epitaxial layer, the sacrificial layer patterns and the integrated circuit substrate using the etch mask pattern as an etch mask, and wherein forming the isolation layer comprises:
    forming an insulation layer in the trench on a surface of the substrate having the trench;
    planarizing the insulation layer until the etch mask pattern is exposed; and
    removing the exposed etch mask pattern.

14. A method of fabricating a MOS transistor, the method comprising:
    forming an epitaxial sacrificial layer on an integrated circuit substrate;
    patterning the sacrificial layer to form sacrificial layer patterns spaced apart from each other;
    forming an epitaxial layer on a surface of the substrate having the sacrificial layer patterns, the epitaxial layer producing junction regions and channel regions;
    forming etch mask patterns on the epitaxial layer;
    etching the epitaxial layer, the sacrificial layer patterns and the integrated circuit substrate to form a trench that defines active regions;
    removing the sacrificial layer patterns to produce buffer regions;
    providing an insulation layer in the trench to form an isolation layer;

forming a gate electrode over the epitaxial layer between the adjacent buffer regions; and implanting impurity ions into the epitaxial layer using the gate electrode as an ion implantation mask to form source/drain junction regions at both sides of the gate electrode.

15. The method of claim 14 further comprising thermally oxidizing the substrate having the trench to form a thermal oxide layer at inner walls of the buffer regions and the trench.

16. The method of claim 14, wherein the integrated circuit substrate is etched after formation of the sacrificial layer patterns.

17. The method of claim 14, wherein the sacrificial layer comprises an epitaxial silicon germanium layer, and the epitaxial layer comprise a silicon layer.

18. The method of claim 14 further comprising forming a protection layer on the sacrificial layer.

* * * * *